US012805223B2

(12) United States Patent
Miyata et al.

(10) Patent No.: US 12,805,223 B2
(45) Date of Patent: Nov. 17, 2026

(54) METHOD OF PROCESSING SUBSTRATE, METHOD OF MANUFACTURING SEMICONDUCTOR DEVICE, RECORDING MEDIUM FOR FORMING OXIDE LAYER AND HYDROPHOBIZING SURFACE THEREOF

(71) Applicant: Kokusai Electric Corporation, Tokyo (JP)

(72) Inventors: Shoma Miyata, Toyama (JP); Kimihiko Nakatani, Toyama (JP); Takayuki Waseda, Toyama (JP); Yoshitomo Hashimoto, Toyama (JP); Yoshiro Hirose, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 421 days.

(21) Appl. No.: 18/467,909

(22) Filed: Sep. 15, 2023

(65) Prior Publication Data

US 2024/0112907 A1 Apr. 4, 2024

(30) Foreign Application Priority Data

Sep. 26, 2022 (JP) ................................ 2022-152821

(51) Int. Cl.
*H10P 14/60* (2026.01)
*C23C 16/455* (2006.01)
*H10P 14/692* (2026.01)

(52) U.S. Cl.
CPC ...... *H10P 14/6546* (2026.01); *H10P 14/6336* (2026.01); *H10P 14/6682* (2026.01); *H10P 14/6922* (2026.01); *C23C 16/45574* (2013.01)

(58) Field of Classification Search
CPC ............ H10P 14/6546; H10P 14/6336; H10P 14/6682; H10P 14/6922; H10P 14/6339;
(Continued)

(56) References Cited

U.S. PATENT DOCUMENTS 6,162,688 A * 12/2000 Gardner ............ H10D 30/0217 438/300
6,258,679 B1 * 7/2001 Burns ................ H10D 30/0225 438/303
(Continued)

FOREIGN PATENT DOCUMENTS

JP S61-248431 A 11/1986
JP H09-162186 A 6/1997
(Continued)

OTHER PUBLICATIONS

Investigation of the Hydrophobic Nature of Metal Oxide Surfaces Created by Atomic Layer Deposition (Year: 2019).*
(Continued)

*Primary Examiner* — Caleb E Henry
*Assistant Examiner* — Pratiksha Jayant Lohakare
(74) *Attorney, Agent, or Firm* — Volpe Koenig

(57) ABSTRACT

There is provided a technique that includes: (a) forming an oxide layer containing a predetermined element on a first film formed on a substrate by supplying a precursor gas containing the predetermined element to the substrate such that hydroxyl group terminations are formed on a surface of the oxide layer and a density of the hydroxyl group terminations on the oxide layer is higher than a density of hydroxyl group terminations on a surface of the first film before (a); and (b) hydrophobizing the surface of the oxide layer by supplying a modifying gas containing a hydrocarbon group to the substrate.

17 Claims, 6 Drawing Sheets

(58) Field of Classification Search
CPC ........... H10P 14/6529; H10P 14/69215; C23C 16/45574; C23C 16/401; C23C 16/45527; C23C 16/56
USPC .......................................................... 438/778
See application file for complete search history.

(56) References Cited

U.S. PATENT DOCUMENTS

| | | | | |
|---|---|---|---|---|
| 10,032,630 | B1 | 7/2018 | Yamamoto et al. | |
| 2004/0063260 | A1* | 4/2004 | Bu | H10D 30/0227 438/197 |
| 2008/0026553 | A1* | 1/2008 | Chua | H10D 64/0134 257/E21.294 |
| 2008/0207007 | A1* | 8/2008 | Thridandam | C23C 16/30 257/E21.24 |
| 2014/0220788 | A1 | 8/2014 | Sano et al. | |
| 2017/0342553 | A1* | 11/2017 | Yu | C23C 16/04 |
| 2018/0033605 | A1 | 2/2018 | Ota et al. | |
| 2018/0166270 | A1 | 6/2018 | Cho et al. | |
| 2021/0202245 | A1 | 7/2021 | Waseda et al. | |
| 2022/0084817 | A1* | 3/2022 | Sharma | H10P 14/61 |
| 2022/0259722 | A1* | 8/2022 | Kim | C23C 16/0272 |

FOREIGN PATENT DOCUMENTS

| | | | |
|---|---|---|---|
| JP | 2016-143874 | A | 8/2016 |
| JP | 2018-152517 | A | 9/2018 |
| JP | 2021-106242 | A | 7/2021 |
| KR | 10-2014-0100895 | A | 8/2014 |
| KR | 10-2019-0095212 | A | 8/2019 |
| WO | 2021/262527 | A1 | 12/2021 |

OTHER PUBLICATIONS

Korean Office Action issued on May 15, 2025 for Korean Patent Application No. 10-2023-0123298.

Japanese Office Action issued on Nov. 26, 2024 for Japanese Patent Application No. 2022-152821.

Bae, J., et al., "Investigation of the Hydrophobic Nature of Metal Oxide Surfaces Created by Atomic Layer Deposition", Langmuir, (2019).

Extended European Search Report issued on Feb. 13, 2024 for European Patent Application No. 23197468.4.

Taiwan Office Action issued on Oct. 24, 2024 for Taiwan Patent Application No. 112134178.

* cited by examiner

METHOD OF PROCESSING SUBSTRATE, METHOD OF MANUFACTURING SEMICONDUCTOR DEVICE, RECORDING MEDIUM FOR FORMING OXIDE LAYER AND HYDROPHOBIZING SURFACE THEREOF

CROSS-REFERENCE TO RELATED APPLICATION

This application is based upon and claims the benefit of priority from Japanese Patent Application No. 2022-152821, filed on Sep. 26, 2022, the entire contents of which are incorporated herein by reference.

TECHNICAL FIELD

The present disclosure relates to a method of processing a substrate, a method of manufacturing a semiconductor device, a recording medium, and a substrate processing apparatus.

BACKGROUND

In the related art, as a process of manufacturing a semiconductor device, a surface of a substrate may be subjected to a hydrophobization treatment.

However, depending on a composition of a base film formed on the surface of the substrate, it may be difficult to satisfactorily hydrophobize the surface of the substrate.

SUMMARY

Some embodiments of the present disclosure provide a technique capable of satisfactorily hydrophobizing a surface of a substrate regardless of a composition of a base film formed on the surface of the substrate.

According to some embodiments of the present disclosure, there is provided a technique that includes: (a) forming an oxide layer containing a predetermined element on a first film formed on the substrate by supplying a precursor gas containing the predetermined element to the substrate such that hydroxyl group terminations are formed on a surface of the oxide layer and a density of the hydroxyl group terminations on the oxide layer is higher than a density of hydroxyl group terminations on a surface of the first film before (a); and (b) hydrophobizing the surface of the oxide layer by supplying a modifying gas containing a hydrocarbon group to the substrate.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
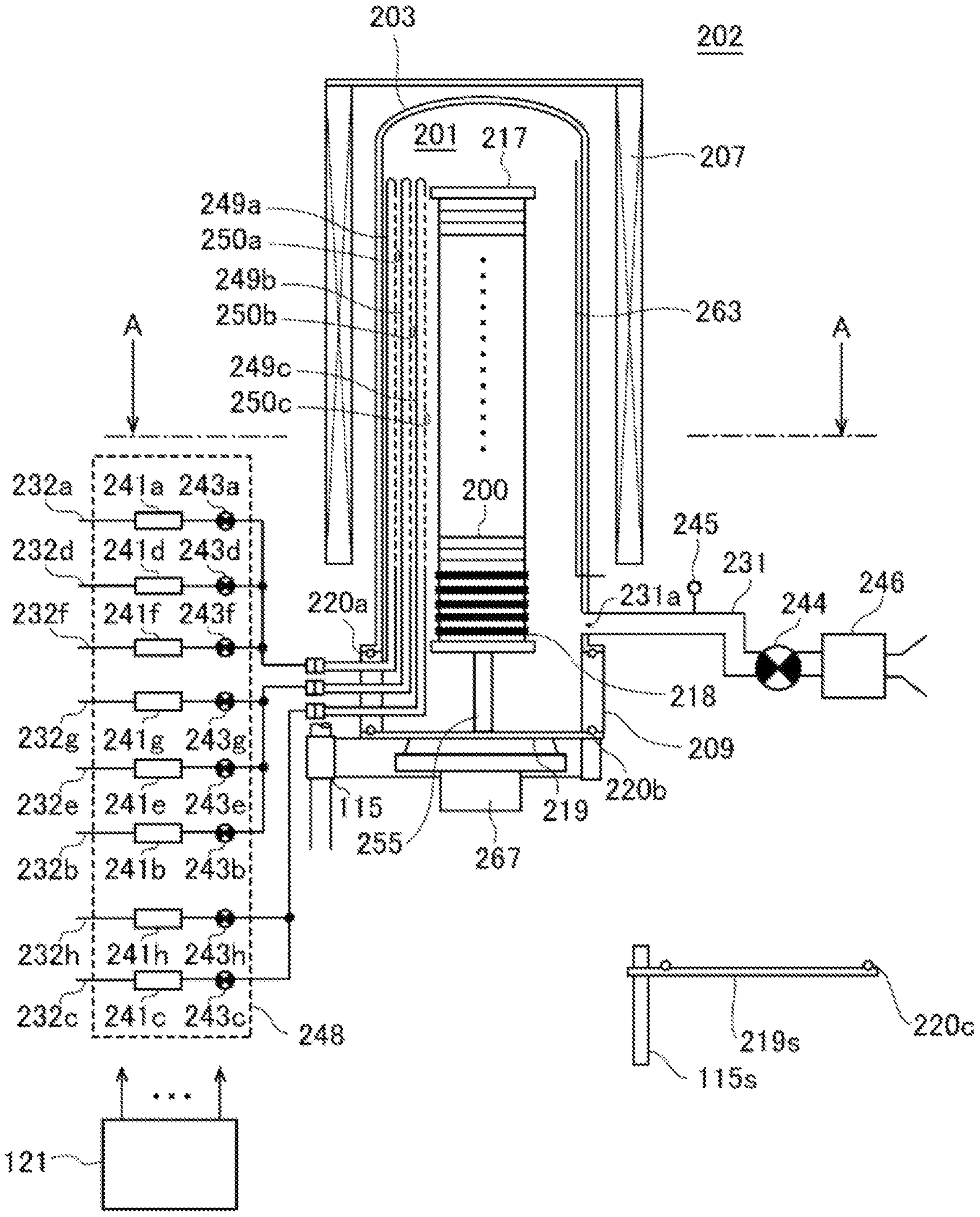
FIG. 1 is a schematic configuration view of a vertical process furnace of a substrate processing apparatus suitably used in embodiments of the present disclosure, in which a portion of the process furnace is illustrated in a vertical and cross-sectional view.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components are not described in detail so as not to obscure aspects of the various embodiments.

First Embodiment of the Present Disclosure

Hereinafter, a first embodiment of the present disclosure will be described mainly with reference to FIGS. 1 to 4 and 5A to 5C. The drawings used in the following description are schematic, and dimensional relationships, ratios, and the like of the respective components shown in the drawings may not match actual ones. Moreover, dimensional relationships, ratios, and the like of the respective components may not match one another among a plurality of drawings.

(1) Configuration of Substrate Processing Apparatus

As shown in FIG. 1, a process furnace 202 includes a heater 207 as a temperature regulator (heating part). The heater 207 is formed in a cylindrical shape and is vertically installed by being supported by a holding plate. The heater 207 also functions as an activator (exciter) configured to activate (excite) a gas with heat.

Inside the heater 207, a reaction tube 203 is arranged concentrically with the heater 207. The reaction tube 203 is made of a heat-resistant material such as, for example, quartz ($SiO_2$) or silicon carbide (SiC) and is formed in a cylindrical shape with its upper end closed and lower end opened. Below the reaction tube 203, a manifold 209 is arranged concentrically with the reaction tube 203. An upper end of the manifold 209 is engaged with a lower end of the reaction tube 203 and is configured to support the reaction tube 203. An O-ring 220*a* as a seal is provided between the manifold 209 and the reaction tube 203. A process container (reaction container) mainly includes the reaction tube 203 and the manifold 209. A process chamber 201 is formed in a hollow area of the process container. The process chamber 201 is configured to be capable of accommodating wafers 200 as substrates. The wafers 200 are processed in the process chamber 201.

Nozzles 249*a* to 249*c* as first to third suppliers are installed in the process chamber 201 so as to penetrate a side wall of the manifold 209. Gas supply pipes 232*a* to 232*c* are connected to the nozzles 249*a* to 249*c*, respectively.

At the gas supply pipes 232*a* to 232*c*, mass flow controllers (MFCs) 241*a* to 241*c*, which are flow rate controllers (flow rate control parts), and valves 243*a* to 243*c*, which are on-off valves, are respectively installed sequentially from the upstream side of a gas flow. Gas supply pipes 232*d* and 232*f* are respectively connected to the gas supply pipe 232*a* on the downstream side of the valve 243*a*. Gas supply pipes 232*e* and 232*g* are respectively connected to the gas supply pipe 232*b* on the downstream side of the valve 243*b*. A gas supply pipe 232*h* is connected to the gas supply pipe 232*c* on the downstream side of the valve 243*c*. At the gas supply pipes 232*d* to 232*h*, MFCs 241*d* to 241*h* and valves 243*d* to 243*h* are respectively installed sequentially from the upstream side of a gas flow.

Figure 2:
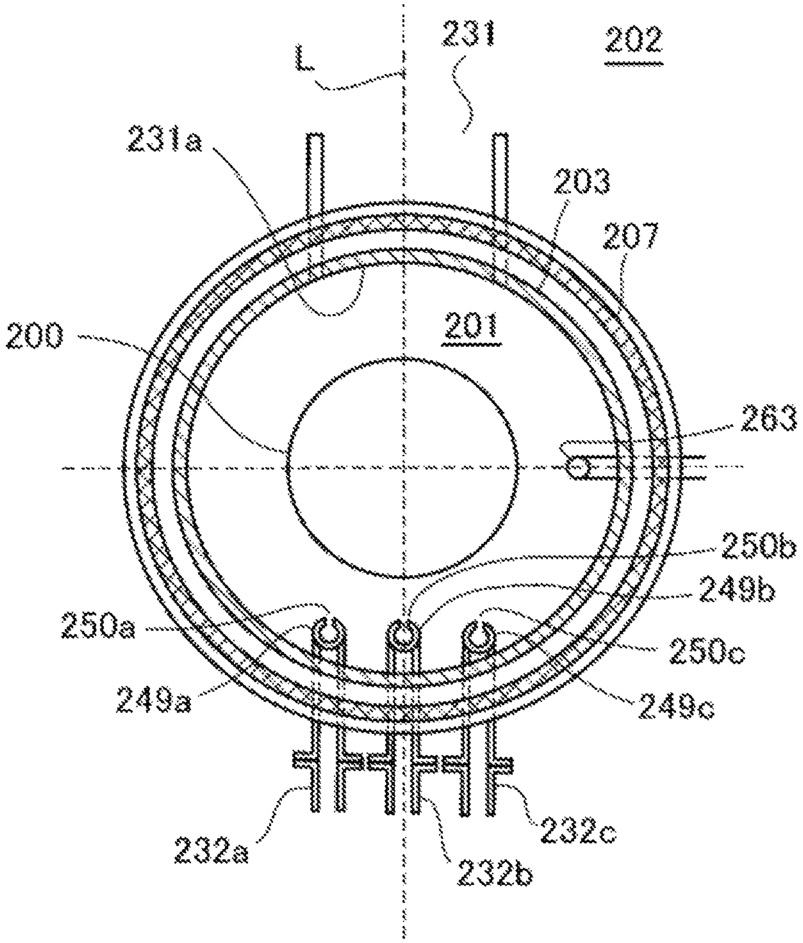
FIG. 2 is a schematic configuration view of a vertical process furnace of the substrate processing apparatus suitably used in embodiments of the present disclosure, in which a portion of the process furnace is illustrated in a cross-sectional view taken along line A-A in FIG. 1.

As shown in FIG. 2, the nozzles 249*a* to 249*c* are arranged in a space of an annular shape in a plane view between an inner wall of the reaction tube 203 and the wafers 200 and are respectively installed to extend upward in an arrangement direction of the wafers 200 from a lower side to an upper side of the inner wall of the reaction tube 203. Gas supply holes 250*a* to 250*c* configured to supply gases are formed on side surfaces of the nozzles 249*a* to 249*c*, respectively. The gas supply holes 250*a* to 250*c* are respectively opened to face an exhaust port 231*a* in the plane view and is configured to be capable of supplying gases toward the wafers 200. The gas supply holes 250*a* to 250*c* are formed from the lower side to the upper side of the reaction tube 203.

A precursor gas containing a predetermined element is supplied from the gas supply pipe 232*a* into the process chamber 201 via the MFC 241*a*, the valve 243*a*, and the nozzle 249*a*.

A modifying gas containing a hydrocarbon group is supplied from the gas supply pipe 232*b* into the process chamber 201 via the MFC 241*b*, the valve 243*b*, and the nozzle 249*b*.

An oxidizing agent is supplied from the gas supply pipe 232*c* into the process chamber 201 via the MFC 241*c*, the valve 243*c*, and the nozzle 249*c*.

A cleaning agent is supplied from the gas supply pipe 232*d* into the process chamber 201 via the MFC 241*d*, the valve 243*d*, the gas supply pipe 232*d*, and the nozzle 249*a*.

A catalyst is supplied from the gas supply pipe 232*e* into the process chamber 201 via the MFC 241*e*, the valve 243*e*, the gas supply pipe 232*e*, and the nozzle 249*b*.

An inert gas is supplied from the gas supply pipes 232*f* to 232*h* into the process chamber 201 via the MFCs 241*f* to 241*h*, the valves 243*f* to 243*h*, the gas supply pipes 232*a* to 232*c*, and the nozzles 249*a* to 249*c*, respectively. The inert gases act as a purge gas, a carrier gas, a dilution gas, and the like.

A precursor gas supply system mainly includes the gas supply pipe 232*a*, the MFC 241*a*, and the valve 243*a*. A modifying gas supply system mainly includes the gas supply pipe 232*b*, the MFC 241*b*, and the valve 243*b*. An oxidizing agent supply system mainly includes the gas supply pipe 232*c*, the MFC 241*c*, and the valve 243*c*. A cleaning agent supply system mainly includes the gas supply pipe 232*d*, the MFC 241*d*, and the valve 243*d*. A catalyst supply system mainly includes the gas supply pipe 232*e*, the MFC 241*e*, and the valve 243*e*. An inert gas supply system mainly includes the gas supply pipes 232*f* to 232*h*, the MFCs 241*f* to 241*h*, and the valves 243*f* to 243*h*.

An exhaust port 231*a* configured to exhaust an atmosphere in the process chamber 201 is installed at the lower side of the side wall of the reaction tube 203. An exhaust pipe 231 is connected to the exhaust port 231*a*. A vacuum pump 246 as an vacuum exhauster is connected to the exhaust pipe 231 via a pressure sensor 245 as a pressure detector (pressure detection part) configured to detect a pressure inside the process chamber 201 and an APC (Auto Pressure Controller) valve 244 as a pressure regulator (pressure regulation part). The APC valve 244 is configured to be capable of performing or stopping vacuum evacuation of an interior of the process chamber 201 by being opened and closed in a state in which the vacuum pump 246 is operated. Furthermore, the APC valve 244 is configured to be capable of regulating the pressure inside the process chamber 201 by adjusting a valve opening degree based on the pressure information detected by the pressure sensor 245 in a state in which the vacuum pump 246 is operated. An exhaust system mainly includes the exhaust pipe 231, the APC valve 244 and the pressure sensor 245. The vacuum pump 246 may be included in the exhaust system.

A seal cap 219 as a furnace opening lid capable of airtightly closing a lower end opening of the manifold 209 is installed below the manifold 209. On the upper surface of the seal cap 219, there is installed an O-ring 220*b* as a seal which comes into contact with the lower end of the manifold 209. Below the seal cap 219, there is installed a rotator 267 configured to rotate a boat 217 described below. A rotary shaft 255 of the rotator 267 is connected to the boat 217 through the seal cap 219. The rotator 267 is configured to rotate the wafers 200 by rotating the boat 217. The seal cap 219 is configured to be raised or lowered in the vertical direction by a boat elevator 115 as an elevator installed outside the reaction tube 203. The boat elevator 115 is constituted as a transfer apparatus (transfer equipment) configured to load or unload (transfer) the wafers 200 into or out of the process chamber 201 by raising or lowering the seal cap 219.

Below the manifold 209, a shutter 219*s* is installed as a furnace opening lid capable of airtightly closing the lower end opening of the manifold 209 in a state in which the seal cap 219 is lowered and the boat 217 is unloaded from the process chamber 201. An O-ring 220*c* as a seal that comes into contact with the lower end of the manifold 209 is installed on the upper surface of the shutter 219*s*. The opening/closing operations (elevating operation, rotating operation, and the like) of the shutter 219*s* are controlled by a shutter opening/closing equipment 115*s*.

A boat 217 serving as a substrate support is configured to support a plurality of wafers 200, for example, 25 to 200 wafers 200, in such a state that the wafers 200 are arranged in a horizontal posture and in multiple stages along a vertical direction with the centers of the wafers 200 aligned with one another. That is, the boat 217 is configured to arrange the wafers 200 to be spaced apart from each other. The boat 217 is made of, for example, a heat-resistant material such as quartz or SiC. Heat insulating plates 218 made of, for example, a heat-resistant material such as quartz or SiC, are supported in multiple stages at the bottom of the boat 217.

A temperature sensor 263 as a temperature detector is installed inside the reaction tube 203. By regulating a state of supply of electric power to the heater 207 based on the temperature information detected by the temperature sensor 263, a temperature distribution inside the process chamber 201 becomes a desired temperature distribution. The temperature sensor 263 is installed along the inner wall of the reaction tube 203.

Figure 3:
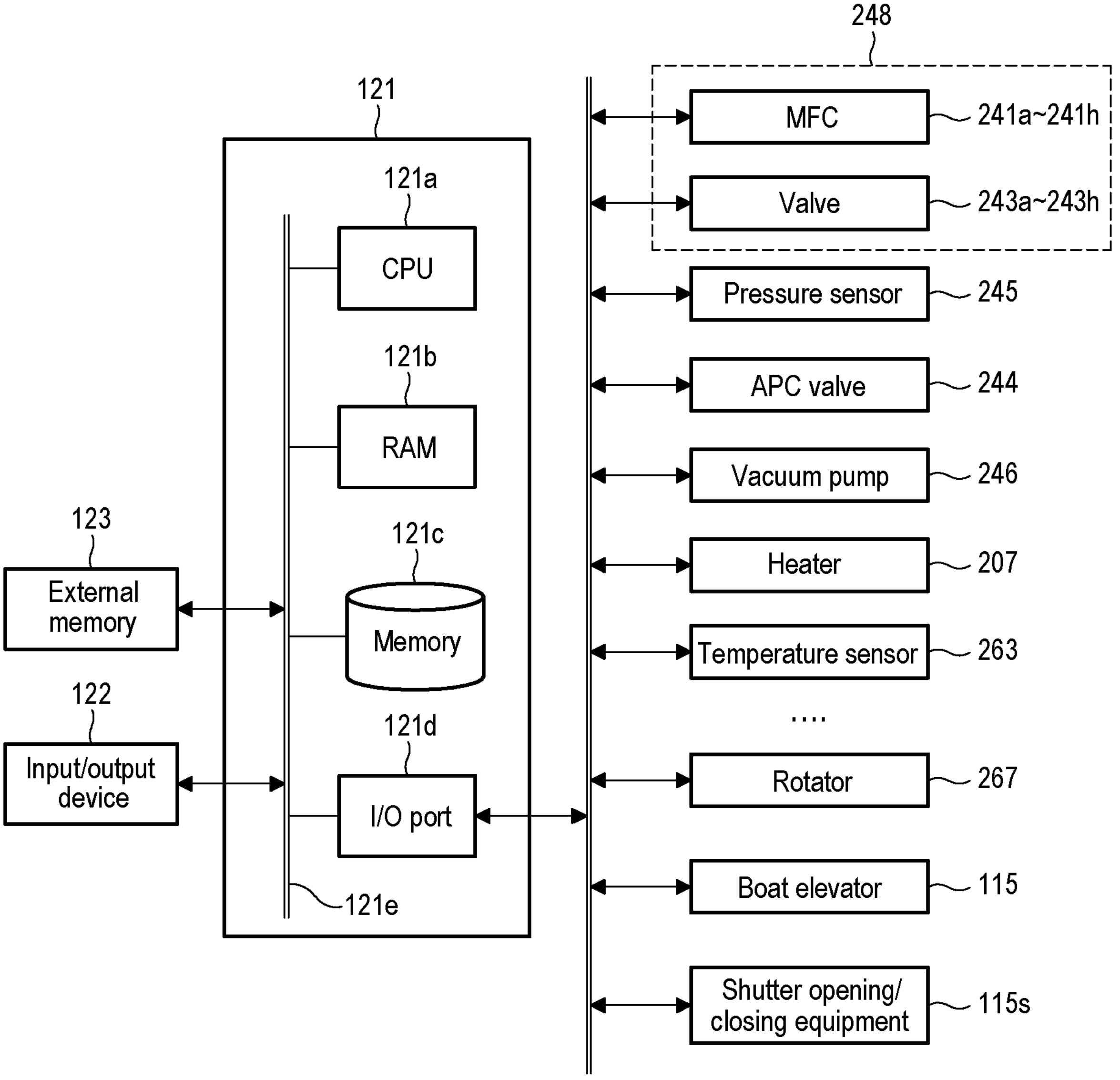
FIG. 3 is a schematic configuration view of a controller of a substrate processing apparatus suitably used in embodiments of the present disclosure, in which a control system of the controller is illustrated in a block diagram.

As shown in FIG. 3, the controller 121 as a control part (control means or unit) is constituted as a computer including a CPU (Central Processing Unit) 121*a*, a RAM (Random Access Memory) 121*b*, a memory 121*c* and an I/O port 121*d*. The RAM 121*b*, the memory 121*c* and the I/O port 121*d* are configured to be capable of exchanging data with the CPU 121*a* via an internal bus 121*e*. An input/output device 122 constituted as, for example, a touch panel or the like is connected to the controller 121. In addition, an external memory 123 can be connected to the controller 121.

The memory 121*c* includes, for example, a flash memory, a HDD (Hard Disk Drive), a SSD (Solid State Drive), or the like. In the memory 121*c*, there are readably recorded and stored a control program that controls the operation of the substrate processing apparatus, a process recipe in which procedures and conditions of substrate processing described below are written, and the like. The process recipe functions as a program that is combined to cause, by the controller 121, the substrate processing apparatus to execute the respective procedures in a below-described substrate processing process so as to obtain a predetermined result. Hereinafter, the process recipe, the control program and the like are collectively and simply referred to as a program. Furthermore, the process recipe is also simply referred to as a recipe. When the term "program" is used herein, it may mean a case of including the recipe, a case of including the control program, or a case of including both the recipe and the control program. The RAM 121*b* is constituted as a memory area (work area) in which programs, data and the like read by the CPU 121*a* are temporarily held.

The I/O port 121*d* is connected to the MFCs 241*a* to 241*h*, the valves 243*a* to 243*h*, the pressure sensor 245, the APC valve 244, the vacuum pump 246, the temperature sensor 263, the heater 207, the rotator 267, the boat elevator 115, the shutter opening/closing equipment 115*s*, and the like.

The CPU 121*a* is configured to be capable of reading and executing the control program from the memory 121*c* and reading the recipe from the memory 121*c* in response to an input of an operation command from the input/output device 122 or the like. The CPU 121*a* is configured to be capable of, according to contents of the recipe thus read, controlling the flow rate regulation operation of various gases (various substances) by the MFCs 241*a* to 241*h*, the opening/closing operations of the valves 243*a* to 243*h*, the opening/closing operation of the APC valve 244, the pressure regulation operation by the APC valve 244 based on the pressure sensor 245, the actuating and stopping operation of the vacuum pump 246, the temperature regulation operation of the heater 207 based on the temperature sensor 263, the operation of rotating the boat 217 with the rotator 267 and the adjusting a rotation speed of the boat 217, the operation of raising or lowering the boat 217 by the boat elevator 115, the opening/closing operation of the shutter 219*s* by the shutter opening/closing equipment 115*s*, and the like.

The controller 121 may be configured by installing, in the computer, the above-described program recorded and stored in an external memory 123. The external memory 123 includes, for example, a magnetic disk such as a HDD or the like, an optical disc such as a CD or the like, a magneto-optical disc such as a MO or the like, a semiconductor memory such as a USB memory, a SSD, or the like, and so forth. The memory 121*c* and the external memory 123 are constituted as a computer readable recording medium. Hereinafter, the memory 121*c* and the external memory 123 are collectively and simply referred to as a recording medium. As used herein, the term "recording medium" may include the memory 121*c*, the external memory 123, or both. The program may be provided to the computer by using a communication means or unit such as the Internet or a dedicated line instead of using the external memory 123.

(2) Substrate Processing Process

As a process of manufacturing a semiconductor device by using the above-described substrate processing apparatus, a method of processing a substrate, i.e., an example of a processing sequence of hydrophobizing a surface of a wafer 200 as a substrate via an oxide layer will be described mainly with reference to FIGS. 4 and 5A to 5C. In the following description, operations of the respective components constituting the substrate processing apparatus are controlled by the controller 121.

A first film as a base is formed on the wafer 200. For the sake of convenience, a case where the first film is a silicon film (Si film) as an oxygen (O)-free film will be described below as a representative example.

According to some embodiments of the present disclosure, a processing sequence includes performing:

(a) a step of forming an oxide layer containing a predetermined element on a first film formed on a wafer 200 by supplying a precursor gas containing the predetermined element to the wafer 200 such that hydroxyl group (OH) terminations are formed on a surface of the oxide layer and a density of the OH terminations on the oxide layer is higher than a density of OH terminations formed on a surface of the first film before forming the oxide layer on the first film (oxide layer formation step); and (b) a step of hydrophobizing the surface of the oxide layer by supplying a modifying gas containing a hydrocarbon group to the wafer 200 on which the oxide layer is formed (hydrophobization step).

Figure 4:
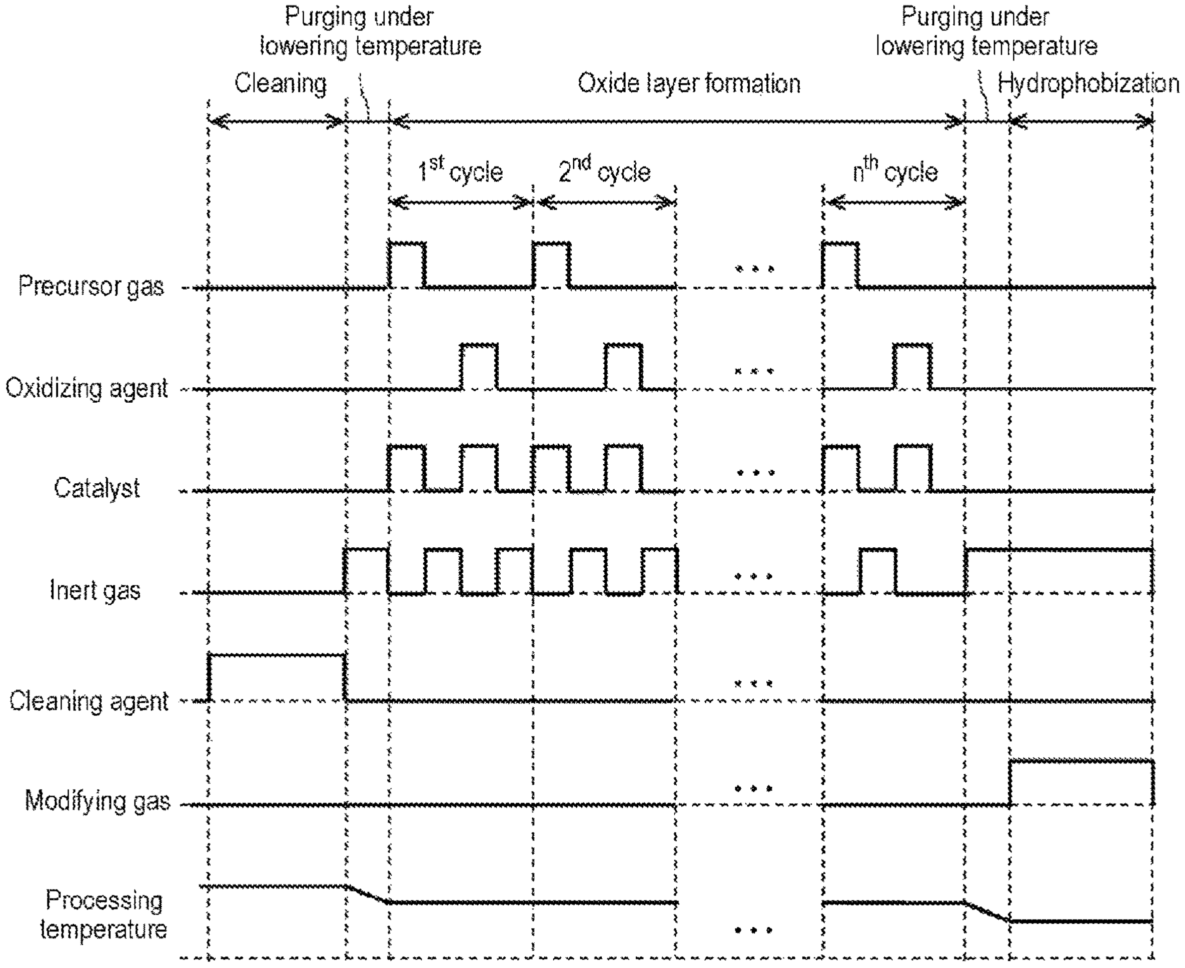
FIG. 4 is a view illustrating a processing sequence according to embodiments of the present disclosure.

Further, in the following example, there is described a case where, as shown in FIG. 4, in the oxide layer formation step, a cycle including a step of supplying the precursor gas to the wafer 200 and a step of supplying an oxidizing agent to the wafer 200 is performed a predetermined number of times, and a catalyst is supplied to the wafer 200 in at least one selected from the group of the step of supplying the precursor gas and the step of supplying the oxidizing agent. As a representative example, FIG. 4 shows an example in which the catalyst is supplied in both the step of supplying the precursor gas and the step of supplying the oxidizing agent.

That is, a processing sequence shown in FIG. 4 shows an example of performing, under a plasma atmosphere:

(a) a step of forming an oxide layer containing a predetermined element on a first film formed on a wafer 200 by performing, a predetermined number of times (n times where n is an integer of 1 or more), a cycle including a step of supplying a precursor gas containing a predetermined element and a catalyst to a wafer 200 on which the first film is formed and a step of supplying an oxidizing agent and a catalyst to the wafer 200 (oxide layer formation step); and (b) a step of hydrophobizing a surface of the oxide layer by supplying a modifying gas containing a hydrocarbon group to the wafer 200 on which the oxide layer is formed (hydrophobization step).

In the present disclosure, for the sake of convenience, the processing sequence described above may also be denoted as follows. The same notation is used also in the following description of modifications and other embodiments.

(precursor gas+catalyst→oxidizing agent+catalyst)×$n$→modifying gas

As in processing sequences denoted below, the catalyst may be supplied to the wafer 200 in at least one selected from the group of the step of supplying the precursor gas and the step of supplying the oxidizing agent.

(precursor gas+catalyst→oxidizing agent)×$n$→modifying gas (precursor gas→oxidizing agent+catalyst)×$n$→modifying gas (precursor gas+catalyst→oxidizing agent+catalyst)×$n$→modifying gas In addition, as in FIG. 4 and processing sequences denoted below, a step of removing, for example, a native oxide film formed on the surface of the first film, by supplying a cleaning agent to the wafer 200 before performing the oxide layer formation step (cleaning step) may be further performed.

cleaning agent→(precursor gas+catalyst→oxidizing agent)×$n$→modifying gas cleaning agent→(precursor gas→oxidizing agent+catalyst)×$n$→modifying gas cleaning agent→(precursor gas+catalyst→oxidizing agent+catalyst)×$n$→modifying gas The term "wafer" used herein may refer to a wafer itself or a stacked body of a wafer and a predetermined layer or film formed on the surface of the wafer. The phrase "a surface of a wafer" used herein may refer to a surface of a wafer itself or a surface of a predetermined layer or the like formed on a wafer. The expression "a predetermined layer is formed on a wafer" used herein may mean that a predetermined layer is directly formed on a surface of a wafer itself or that a predetermined layer is formed on a layer or the like formed on a wafer. The term "substrate" used herein may be synonymous with the term "wafer."

As used herein, the term "agent" includes at least one selected from the group of a gaseous substance and a liquid substance. The liquid substance includes a mist substance. That is, the cleaning agent and the oxidizing agent may include a gaseous substance, a liquid substance such as a mist substance or the like, or both of them.

As used herein, the term "layer" includes at least one selected from the group of a continuous layer and a discontinuous layer.

(Wafer Charging and Boat Loading)

After a plurality of wafers 200 are charged to the boat 217 (wafer charging), the shutter 219*s* is moved by the shutter opening/closing equipment 115*s* to open the lower end opening of the manifold 209 (shutter opening). Thereafter, as shown in FIG. 1, the boat 217 supporting the plurality of wafers 200 is lifted by the boat elevator 115 and loaded into the process chamber 201 (boat loading). In such a state, the seal cap 219 seals the lower end of the manifold 209 via the O-ring 220*b*. Thus, the wafer 200 is prepared in the process chamber 201.

Figure 5A:
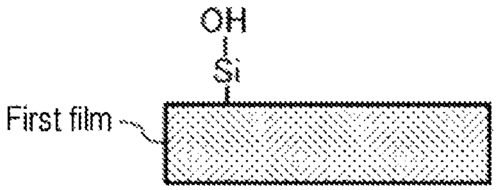
FIG. 5A is a schematic and cross-sectional view showing a surface of a wafer on which a first film is formed.
Figure 5B:
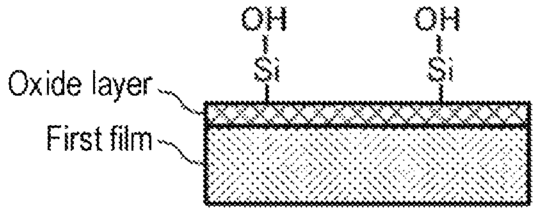
FIG. 5B is a schematic and cross-sectional view showing the surface of the wafer after an oxide layer is formed on a surface of the first film by supplying a precursor gas to the wafer in the state of FIG. 5A.

On the surface of the wafer 200 charged to the boat 217, as shown in FIG. 5A, a first film is formed as a base. A case where the first film is a Si film as described above will be described here as an example. Further, a case where a step (cleaning step) of cleaning the surface of the first film is performed before performing the oxide layer formation step is described herein as an example.

(Pressure Regulation and Temperature Regulation)

After the boat loading is completed, the inside of the process chamber 201, that is, a space where the wafer 200 are placed, is vacuum-exhausted (decompression-exhausted) by the vacuum pump 246 to reach a desired pressure (state of vacuum). In this operation, the pressure inside the process chamber 201 is measured by the pressure sensor 245, and the APC valve 244 is feedback-controlled based on the measured pressure information. Furthermore, the wafer 200 in the process chamber 201 is heated by the heater 207 to reach a desired processing temperature. At this time, a state of supply of electric power to the heater 207 is feedback-controlled based on the temperature information detected by the temperature sensor 263 such that a temperature distribution inside the process chamber 201 becomes a desired temperature distribution. Moreover, the rotation of the wafer 200 by the rotator 267 is started. The exhaust of the inside of the process chamber 201 and the heating and rotation of the wafer 200 are continuously performed at least until the processing on the wafer 200 is completed.

(Cleaning Step)

Thereafter, a cleaning agent is supplied to the wafer 200.

Specifically, the valve 243*d* is opened to allow the cleaning agent to flow through the gas supply pipe 232*d*. A flow rate of the cleaning agent is regulated by the MFC 241*d*. The cleaning agent is supplied into the process chamber 201 via the gas supply pipe 232*d* and the nozzle 249*a*, and exhausted via the exhaust port 231*a*. At this time, the cleaning agent is supplied to the wafer 200 from the lateral side of the wafer 200 (supply of cleaning agent). At this time, the valves 243*f* to 243*h* may be opened to supply an inert gas into the process chamber 201 via the nozzles 249*a* to 249*c* respectively.

By supplying the cleaning agent to the wafer 200 under processing conditions described below, it is possible to remove (tech), for example, a native oxide film formed on the surface of the first film to expose the surface of the first film. At this time, as shown in FIG. 5A, the surface of the first film is in a state in which no OH termination is formed in many regions, i.e., a state in which OH terminations are formed in some regions and a distribution of OH terminations become non-uniform.

A processing condition when the cleaning agent is supplied in the cleaning step is exemplified as follows:

Processing temperature: 50 to 200 degrees C., specifically 70 to 150 degrees C.

Processing pressure: 10 to 2000 Pa, specifically 100 to 1500 Pa

Processing time: 10 to 60 minutes, specifically 30 to 60 minutes

Supply flow rate of cleaning agent: 0.05 to 1 slm, specifically 0.1 to 0.5 slm

Supply flow rate of inert gas (for each gas supply pipe): 0 to 10 slm, specifically 2 to 10 slm.

In the present disclosure, expression of a numerical range such as "50 to 200 degrees C." means that a lower limit and an upper limit thereof are included in the range. Therefore, for example, "50 to 200 degrees C." means "50 degrees C. or higher and 200 degrees C. or lower." The same applies to other numerical ranges. Further, the processing temperature in the present disclosure means the temperature of the wafer 200 or the temperature inside the process chamber 201, and the processing pressure means the pressure inside the process chamber 201. Moreover, the processing time means a time during which the processing is continued. In addition, when 0 slm is included in the supply flow rate, 0 slm means a case where the substance (gas) is not supplied. These also hold true in the following description.

After cleaning the surface of the first film, the valve 243*d* is closed to stop the supply of the cleaning agent into the process chamber 201. Then, the inside of the process chamber 201 is vacuum-exhausted to remove gaseous substances remaining in the process chamber 201 from the process chamber 201. In this operation, the valves 243*f* to 243*h* are opened to supply the inert gas into the process chamber 201 via the nozzles 249*a* to 249*c*. The inert gas supplied from the nozzles 249*a* to 249*c* acts as a purge gas, thereby purging the inside of the process chamber 201 (purging).

A processing condition when the purging is performed in the cleaning step is exemplified as follows:

Processing pressure: 1 to 30 Pa

Processing time: 1 to 120 seconds, specifically 1 to 60 seconds

Supply flow rate of inert gas (for each gas supply pipe): 0.5 to 20 slm.

The processing temperature when the purging is performed in this step may be the same as the processing temperature when the cleaning agent is supplied.

As the cleaning agent, for example, a fluorine (F)-containing gas may be used. As the F-containing gas, for example, a chlorine trifluoride ($ClF_3$) gas, a chlorine fluoride (ClF) gas, a nitrogen fluoride ($NF_3$) gas, a hydrogen fluoride (HF) gas, a fluorine ($F_2$) gas, and the like may be used. Further, as the cleaning agent, for example, an acetic acid ($CH_3COOH$) gas, a formic acid (HCOOH) gas, a hexafluoroacetylacetone ($C_5H_2F_6O_2$) gas, a hydrogen ($H_2$) gas, and the like may be used. Various cleaning liquids may also be used as the cleaning agent. For example, an aqueous acetic acid solution, an aqueous formic acid solution, and the like may be used as the cleaning agent. Further, for example, DHF cleaning may be performed by using an aqueous HF solution as the cleaning agent. Moreover, for example, SC-1 cleaning (APM cleaning) may be performed by using a cleaning liquid containing ammonia water, hydrogen peroxide water, and pure water as the cleaning agent. In addition, for example, SC-2 cleaning (HPM cleaning) may be performed by using a cleaning liquid containing hydrochloric acid, hydrogen peroxide, and pure water as the cleaning agent. Further, for example, SPM cleaning may be performed by using a cleaning liquid containing sulfuric acid and hydrogen peroxide water as the cleaning agent. That is, the cleaning agent may be a gaseous substance or a liquid substance. Further, the cleaning agent may be a liquid substance such as a mist substance or the like. One or more selected from the group of these substances may be used as the cleaning agent.

As the inert gas, a nitrogen ($N_2$) gas and a rare gas such as an argon (Ar) gas, a helium (He) gas, a neon (Ne) gas or a xenon (Xe) gas may be used. One or more selected from the group of these gases may be used as the inert gas. This point holds true in each step described later.

In the case of using a wafer 200 kept in a state where the surface of the first film is cleaned in advance, and, for example, the native oxide film formed on the surface of the first film is removed, the cleaning step may be omitted.

(Oxide Layer Formation Step)

After the cleaning step is performed, a precursor gas and an oxidizing agent are supplied to the wafer 200 to form an oxide layer on the first film as a base formed on the wafer 200. More specifically, a precursor gas supply step and an oxidizing agent supply step are sequentially executed. In the precursor gas supply step and the oxidizing agent supply step, the output of the heater 207 is regulated to maintain a state in which the temperature of the wafer 200 is equal to or lower than the temperature of the wafer 200 in the cleaning step, specifically lower than the temperature of the wafer 200 in the cleaning step, as shown in FIG. 4.

[Precursor Gas Supply Step]

In this step, a precursor gas containing a predetermined element and a catalyst (catalyst gas) are supplied to the wafer 200 subjected to the cleaning step.

Specifically, the valves 243*a* and 243*e* are opened to allow a precursor gas and a catalyst to flow through the gas supply pipes 232*a* and 232*e*, respectively. Flow rates of the precursor gas and the catalyst are regulated the MFCs 241*a* and 241*e*, respectively. The precursor gas and the catalyst are supplied into the process chamber 201 via the nozzles 249*a* and 249*b*, mixed in the process chamber 201, and exhausted via the exhaust port 231*a*. At this time, the precursor gas and the catalyst are supplied to the wafer 200 from the lateral side of the wafer 200 (precursor gas+catalyst supply). At this time, the valves 243*f* to 243*h* may be opened to supply the inert gas into the process chamber 201 via the nozzles 249*a* to 249*c* respectively.

A Si-containing layer is formed as a first layer on the surface of the first film by supplying, for example, a precursor gas containing silicon (Si) as a predetermined element to the wafer 200 under processing conditions described below.

By forming the first layer under the temperature conditions described below, the precursor gas may be prevented from being thermally decomposed (decomposed in vapor phase), i.e., from being autolyzed in the process chamber 201. As a result, it is possible to prevent Si contained in the precursor gas from being multiple-deposited on the first film, and cause Si to be adsorbed on the first film.

A processing condition when the precursor gas and the catalyst are supplied is exemplified as follows:

Processing temperature: room temperature (25 degrees C.) to 200 degrees C., specifically room temperature to 150 degrees C., more specifically room temperature to 100 degrees C.

Processing pressure: 133 to 1333 Pa

Supply flow rate of precursor gas: 0.001 to 2 slm

Supply flow rate of catalyst: 0.001 to 2 slm

Supply flow rate of inert gas (for each gas supply pipe): 0 to 20 slm

Supply time of each gas: 1 to 120 seconds, specifically 1 to 60 seconds.

After the first layer is formed on the surface of the first film, the valves 243*a* and 243*e* are closed to stop the supply of the precursor gas and the catalyst into the process chamber 201. Then, gaseous substances and the like remaining in the process chamber 201 are removed from the process chamber 201 by the same processing procedure and processing condition as in the purging in the cleaning step (purging). The processing temperature when the purging is performed in this step may be the same as the processing temperature when the precursor gas and the catalyst are supplied.

For example, a Si- and halogen-containing gas (Si- and halogen-containing substance) may be used as the precursor gas. Halogen includes chlorine (Cl), fluorine (F), bromine (Br), iodine (I), and the like. The Si- and halogen-containing gas may contain halogen in the form of a chemical bond between Si and halogen. As the Si- and halogen-containing gas, for example, a silane-based gas containing Si—Cl bonds, i.e., a chlorosilane-based gas may be used. The Si- and halogen-containing gas may further contain C, and in such a case, it may contain C in the form of Si—C bonds. As the Si- and halogen-containing gas, for example, a silane-based gas containing Si, Cl and an alkylene group and containing Si—C bonds, i.e., an alkylenechlorosilane-based gas may be used. Alkylene group includes methylene group, ethylene group, propylene group, butylene group, and the like. As the Si- and halogen-containing gas, for example, a silane-based gas containing Si, Cl, and an alkyl group and containing Si—C bonds, i.e., an alkylchlorosilane-based gas may be used. Alkyl group includes methyl group, ethyl group, propyl group, butyl group, and the like. The Si- and halogen-containing gas may further contain O, and in such a case, it may contain O in the form of Si—O bonds, for example, in the form of siloxane bonds (Si—O—Si bonds). As the Si- and halogen-containing gas, for example, a silane-based gas containing Si, Cl and siloxane bonds, i.e., a chlorosiloxane-based gas may be used. These gases may contain Cl in the form of Si—Cl bonds. In addition to these, an amino group-containing gas (amino group-containing substance) such as an aminosilane-based gas or the like may also be used as the precursor gas.

Examples of the precursor gas may include a bis(trichlorosilyl)methane ($(SiCl_3)_2CH_2$) gas, a 1,2-bis(trichlorosilyl) ethane ($(SiCl_3)_2C_2H_4$) gas, a 1,1,2, 2-tetrachloro-1,2-dimethyldisilane ($(CH_3)_2Si_2Cl_4$) gas, a 1,2-dichloro-1,1,2,2-tetramethyldisilane ($(CH_3)_4Si_2Cl_2$) gas, a 1,1,3,3-tetrachloro-1,3-disilacyclobutane ($C_2H_4Cl_4Si_2$) gas, and the like. Further, examples of the precursor gas include a tetrachlorosilane ($SiCl_4$) gas, a hexachlorodisilane ($Si_2Cl_6$) gas, an octachlorotrisilane ($Si_3Cl_8$) gas, and the like. In addition, examples of the precursor gas include a hexachlorodisiloxane ($Cl_3Si—O—SiCl_3$) gas, an octachlorotrisiloxane ($Cl_3Si—O—SiCl_2—O—SiCl_3$) gas, and the like. One or more selected from the group of these gases may be used as the precursor gas.

Examples of the precursor gas include a tetrakis(dimethylamino)silane ($Si[N(CH_3)_2]_4$) gas, a tris(dimethylamino) silane ($Si[N(CH_3)_2]_3H$) gas, a bis(diethylamino)silane ($Si[N(C_2H_5)_2]_2H_2$) gas, a bis(tert-butylamino)silane ($SiH_2[NH(C_4H_9)]_2$) gas, a (diisopropylamino)silane ($SiH_3[N(C_3H_7)_2]$) gas, and the like. One or more selected from the group of these gases may be used as the precursor gas.

As the catalyst, for example, an amine-based gas (amine-based substance) containing carbon (C), nitrogen (N), and hydrogen (H) may be used. As the amine-based gas (amino-based substance), a cyclic amine-based gas (cyclic amine-based substance) or a chain-like amine-based gas (chain-like amine-based substance) may be used. Examples of the catalyst include cyclic amine such as pyridine ($C_5H_5N$), aminopyridine ($C_5H_6N_2$), picoline ($C_6H_7N$), lutidine ($C_7H_9N$), pyrimidine ($C_4H_4N_2$), quinoline ($C_9H_7N$), piperazine ($C_4H_{10}N_2$), piperidine ($C_5H_{11}N$), aniline ($C_6H_7N$), or the like. Further, examples of the catalyst include chain-like amine such as triethylamine ($(C_2H_5)_3N$), diethylamine ($(C_2H_5)_2NH$), monoethylamine ($(C_2H_5)NH_2$), trimethylamine ($(CH_3)_3N$), dimethylamine ($(CH_3)_2NH$), monomethylamine ($(CH_3)NH_2$), or the like. One or more selected from the group of these substances may be used as the catalyst. This point also holds true in the oxidizing agent supply step, which is described below.

[Oxidizing Agent Supply Step]

After the precursor gas supply step is completed, an oxidizing agent (reaction gas) and a catalyst are supplied to the wafer 200, i.e., the wafer 200 after the first layer is formed on the surface of the first film.

Specifically, the valves 243*c* and 243*e* are opened to allow the oxidizing agent and the catalyst to flow through the gas supply pipes 232*c* and 232*e*, respectively. Flow rates of the oxidizing agent and the catalyst are regulated by the MFCs 241*c* and 241*e*, respectively. The oxidizing agent and the catalyst are supplied into the process chamber 201 via the nozzles 249*c* and 249*b*, mixed in the process chamber 201, and exhausted from the exhaust port 231*a*. In this operation, the oxidizing agent and the catalyst are supplied to the wafer 200 from the lateral side of the wafer 200 (oxidizing agent+catalyst supply). At this time, the valves 243*f* to 243*h* may be opened to supply the inert gas into the process chamber 201 via the nozzles 249*a* to 249*c* respectively.

At least a portion of the first layer formed on the surface of the first film in the precursor gas supply step is oxidized by supplying the oxidizing agent to the wafer 200 under processing conditions described below. As a result, a second layer obtained by oxidizing the first layer and forming OH terminations on the surface is formed on the surface of the first film as a base.

By forming the second layer under temperature conditions described below, it is possible to form the second layer while suppressing removal (desorption) of the OH terminations from a surface of the second layer.

A processing condition when the oxidizing agent and the catalyst are supplied is exemplified as follows:

Processing temperature: room temperature (25 degrees C.) to 200 degrees C., specifically room temperature to 150 degrees C., more specifically room temperature to 100 degrees C.

Processing pressure: 133 to 1333 Pa

Supply flow rate of oxidizing agent: 0.001 to 2 slm

Supply flow rate of catalyst: 0.001 to 2 slm

Supply flow rate of inert gas (each gas supply pipe): 0 to 20 slm

Supply time of each gas: 1 to 120 seconds, specifically 1 to 60 seconds.

After the first layer formed on the surface of the first film is oxidized and changed (converted) into the second layer, the valves 243*c* and 243*e* are closed to stop the supply of the oxidizing agent and the catalyst into the process chamber 201. Then, the gaseous substances remaining in the process chamber 201 are removed from the process chamber 201 by the same processing procedure and processing condition as the purging in the cleaning step (purging). The processing temperature when the purging is performed in this step is specifically the same as the processing temperature when the oxidizing agent and the catalyst are supplied.

As the oxidizing agent, for example, an oxygen (O)- and hydrogen (H)-containing gas (O- and H-containing substance) may be used. As the O- and H-containing gas, for example, a water vapor ($H_2O$ gas), a hydrogen peroxide ($H_2O_2$) gas, hydrogen ($H_2$) gas+oxygen ($O_2$) gas, $H_2$ gas+ozone ($O_3$) gas, or the like may be used. That is, O-containing gas+H-containing gas may be used as the O- and H-containing gas. In such a case, a deuterium ($D_2$) gas may be used instead of the $H_2$ gas as the H-containing gas. As the oxidizing agent, one or more selected from the group of these gases may be used.

Joint writing of two gases such as "$H_2$ gas+$O_2$ gas" in the present disclosure means a mixed gas of $H_2$ gas and $O_2$ gas. When the mixed gas is supplied, two gases may be mixed (premixed) in a supply pipe, and then supplied into the process chamber 201, or two gases may be supplied into the process chamber 201 separately via different supply pipes and then mixed (post-mixed) in the process chamber 201.

As the oxidizing agent, in addition to the O- and H-containing gas, an O-containing gas (O-containing substance) may be used. Examples of the O-containing gas may include an $O_2$ gas, an $O_3$ gas, a nitrous oxide ($N_2O$) gas, a nitric oxide (NO) gas, a nitrogen dioxide ($NO_2$) gas, a carbon monoxide (CO) gas, and a carbon dioxide ($CO_2$). As the oxidizing agent, in addition to these gases, the various aqueous solutions and various cleaning liquids described above may also be used. In such a case, an object to be oxidized on the surface of the wafer 200 may be oxidized by exposing the wafer 200 to the cleaning liquids. One or more selected from the group of these substances may be used as the oxidizing agent.

As the catalyst, for example, catalysts similar to the various catalysts exemplified in the precursor gas supply step described above may be used.

[Performing a Predetermined Number of Times]

By performing, a predetermined number of times (n times where n is an integer of 1 or more), a cycle in which the precursor gas supply step and the oxidizing agent supply step are alternately performed non-simultaneously, i.e., without synchronization, an oxide layer whose surface is OH-terminated may be formed on the first film formed on the wafer 200. For example, when the precursor gas and the oxidizing agent described above are used, a silicon oxycarbide layer (SiOC layer) or a silicon oxide layer (SiO layer) may be formed on the first film as an oxide layer containing Si as a predetermined element. The above-described cycle may be performed multiple times. That is, a thickness of the second layer formed per cycle is set to be smaller than a desired film thickness, and the above-described cycle may be performed multiple times until a thickness of the oxide layer formed by stacking the second layer reaches a desired film thickness, for example, 1.5 to 5 nm. By supplying the precursor gas and the oxidizing agent to the wafer 200 under the processing condition described above, it is possible to form a uniform and sufficiently thin oxide layer.

By performing the oxide layer formation step under the above-described processing condition, a density of the OH terminations formed on the surface of the oxide layer may be made higher than a density of the OH terminations on the surface of the first film before the oxide layer formation step. In addition, a density distribution of the OH terminations formed on the surface of the oxide layer may be made more uniform than a density distribution of the OH terminations on the surface of the first film before the oxide layer formation step (see FIGS. 5A and 5B).

In the oxide layer formation step, by supplying the catalyst together with the precursor gas or the oxidizing agent, the above-described reaction may proceed in a non-plasma atmosphere and under the low temperature condition as described above. By performing the oxide layer formation step under the temperature condition equal to or lower than the processing temperature when the first film is formed, for example, it is possible to suppress an influence of thermal history on the structure on the wafer 200 including the first film.

(Hydrophobization Step)

After performing the oxide layer formation step, a modifying gas is supplied to the wafer 200 to hydrophobize the surface of the oxide layer formed on the first film. In the hydrophobization step, an output of the heater 207 is regulated such that the temperature of the wafer 200 is kept equal to or lower than the temperature of the wafer 200 in the precursor gas supply step and the oxidizing agent supply step, specifically lower than the temperature of the wafer 200 in the precursor gas supply step and the oxidizing agent supply step as shown in FIG. 4.

Specifically, the valve 243*b* is opened to allow a modifying gas to flow through the gas supply pipe 232*b*. Flow rate of the modifying gas is regulated by the MFC 241*b*. The modifying gas is supplied into the process chamber 201 via the nozzle 249*b*, and exhausted via the exhaust port 231*a*. At this time, the modifying gas is supplied to the wafer 200 from the lateral side of the wafer 200 (supply of modifying gas). At this time, the valves 243*f* to 243*h* may be opened to supply the inert gas into the process chamber 201 via the nozzles 249*a* to 249*c* respectively.

Figure 5C:
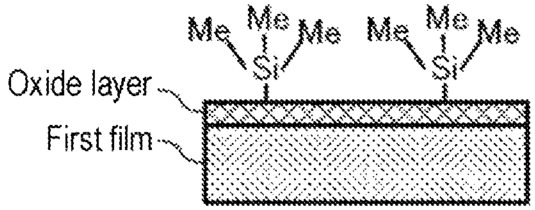
FIG. 5C is a schematic and cross-sectional view showing the surface of the wafer after a surface of the oxide layer is hydrophobized by supplying a modifying gas to the wafer in the state of FIG. 5B.

By supplying a modifying gas containing a hydrocarbon group, which is a hydrophobic substituent, to the wafer 200 under processing conditions described below, the modifying gas and the OH terminating the surface of the oxide layer may be caused to react with each other to hydrophobize the surface of the oxide layer. Specifically, by supplying the modifying gas to the wafer 200, the hydrocarbon group contained in the modifying gas is chemically adsorbed on OH, which is an adsorption site on the surface of the oxide layer, such that the surface of the oxide layer is terminated with a hydrocarbon group, which is a hydrophobic substituent. The surface of the oxide layer terminated with the hydrocarbon group becomes hydrophobic. In other words, a modified layer constituted by a hydrophobic substituent is formed on the surface of the oxide layer. For example, when the hydrocarbon group contained in the modifying gas is a methyl group, the surface of the oxide layer is terminated with the methyl group as shown in FIG. 5C. Thus, the surface of the wafer 200 is hydrophobized via the oxide layer.

By supplying the modifying gas under the temperature condition described below, it is possible to suppress desorption of the OH termination formed on the oxide layer.

A processing condition when the modifying gas is supplied in the hydrophobization step is exemplified as follows:

- Processing temperature: room temperature (25 degrees C.) to 250 degrees C., specifically room temperature to 150 degrees C., more specifically room temperature to 100 degrees C.
- Processing pressure: 5 to 2000 Pa, specifically 10 to 1000 Pa
- Processing time: 1 second to 120 minutes, specifically 30 seconds to 60 minutes
- Supply flow rate of modifying gas: 0.001 to 3 slm, specifically 0.001 to 0.5 slm
- Supply flow rate of inert gas (each gas supply pipe): 0 to 20 slm.

This step may be performed at the same temperature as the temperature condition in the oxide layer formation step or at a temperature lower than the temperature condition in the oxide layer formation step. As used herein, the term "same temperature" includes a temperature with a difference within a range of, for example, ±5 degrees C., as well as exactly the same temperature.

As the modifying gas, for example, a compound represented by the following formula (1) may be used.

$$[R^{11}]n^1\text{—}(X^1)\text{—}[R^{12}]m^1 \qquad (1)$$

In the above-described formula (1), $R^{11}$ denotes a first substituent directly bonded to X, $R^{12}$ denotes a second substituent directly bonded to X, $X^1$ denotes a tetravalent atom selected from the group of a carbon (C) atom, a Si atom, a germanium (Ge) atom and a tetravalent metal atom, $n^1$ denotes an integer of 1 to 3, $m^1$ denotes an integer of 1 to 3, and $n_1+m^1=4$.

In the formula (1), the number of $R^{11}$ as the first substituent, i.e., $n^1$, is an integer of 1 to 3, more specifically 2 or 3. When $n^1$ is 2 or 3, the first substituents $R^{11}$ may be the same or different.

The first substituent represented by $R^{11}$ is specifically a hydrocarbon group, a hydrogen group (—H), an alkoxy group, a fluoro group, or a fluoroalkyl group. Among them, the first substituent represented by $R^{11}$ is specifically a hydrogen group or a hydrocarbon group, more specifically a hydrocarbon group. Herein, the hydrocarbon group may be an aliphatic hydrocarbon group such as an alkyl group, an alkenyl group, an alkynyl group, or the like, or may be an aromatic hydrocarbon group.

The partial structural alkyl group in the hydrocarbon group and alkoxy group as the first substituent is specifically an alkyl group containing 1 to 4 carbon atoms. The alkyl group may be linear or branched. Specific examples of the alkyl groups containing 1 to 4 carbon atoms include a methyl group, an ethyl group, an n-propyl group, an n-butyl group, an isopropyl group, an isobutyl group, a sec-butyl group, a tert-butyl group, and the like. Specific examples of the alkoxy group as the first substituent include a methoxy group, an ethoxy group, an n-propoxy group, an n-butoxy group, an isopropoxy group, an isobutoxy group, a sec-butoxy group, a tert-butoxy group, and the like.

In the formula (1), the number of $R^{12}$ as the second substituent, i.e., $m^1$, is an integer of 1 to 3, specifically 1 or 2. When $m^1$ is 2 or 3, the second substituents $R^{12}$ may be the same or different.

The second substituent represented by $R^{12}$ is specifically a substituent that allows chemisorption of the modifying gas to adsorption sites (e.g., OH terminations) on the surface of the oxide layer.

The second substituent represented by $R^{12}$ includes an amino group, a chloro group, a bromo group, an iodo group, a hydroxy group, and the like. Among them, the second substituent represented by $R^{12}$ is specifically an amino group, more specifically a substituted amino group. In particular, from the viewpoint of adsorption of the modifying gas to the oxide layer, the second substituents represented by $R^{12}$ may be substituted amino groups.

The substituent of the substituted amino group is specifically an alkyl group, more specifically an alkyl group containing 1 to 5 carbon atoms, and even more specifically an alkyl group containing 1 to 4 carbon atoms. The alkyl group of the substituted amino group may be linear or branched. Specific examples of the alkyl group of the substituted amino group include a methyl group, an ethyl group, an n-propyl group, an n-butyl group, an isopropyl group, an isobutyl group, a sec-butyl group, a tert-butyl group, and the like.

The substituted amino group contains one or two substituents, specifically two substituents. When the substituted amino group contains two substituents, the two substituents may be the same or different.

In the formula (1), the atom to which the first substituent and the second substituent represented by $X^1$ are directly bonded is a tetravalent atom selected from the group of a C atom, a Si atom, a Ge atom, and a tetravalent metal atom. Herein, examples of tetravalent metal atom include a titanium (Ti) atom, a zirconium (Zr) atom, a hafnium (Hf) atom, a molybdenum (Mo) atom, a tungsten (W) atom, and the like.

Among them, the atom to which the first substituent and the second substituent represented by $X^1$ are directly bonded may be a C atom, a Si atom, and a Ge atom. When $X^1$ is a C atom, a Si atom, or a Ge atom, this is because it is possible to obtain at least one selected from the group of a high adsorption of the modifying gas to the surface of the oxide layer and a high chemical stability of the modifying gas adsorbed on the surface of the oxide layer, i.e., the residue derived from the modifying gas. Among them, X is specifically a Si atom. This is because when X is a Si atom, both the high adsorption of the modifying gas on the surface of the oxide layer and the high chemical stability of the modifying gas adsorbed on the surface of the oxide layer, i.e., the residue derived from the modifying gas, may be obtained in a balanced manner.

Although the compound represented by the formula (1) is described above, the modifying gas is not limited to the compound represented by the formula (1). For example, the modifying gas is specifically constituted by a molecule containing the above-described first substituent, the above-described second substituent, and the atom to which the first substituent and the second substituent are directly bonded. However, the atom to which the first substituent and the second substituent are directly bonded may be a metal atom capable of bonding to five or more ligands. When the atom to which the first substituent and the second substituent is directly bonded is a metal atom capable of bonding to five or more ligands, the number of the first substituent and the second substituent in the molecule of the modifying gas may be greater than that of the compound represented by the formula (1). In addition, the modifying gas may be constituted by a molecule containing the above-described first substituent, the above-described second substituent, and two or more atoms to which the first substituent and the second substituent are directly bonded.

Specific examples of the modifying gas may include aminosilane-based gases such as $(CH_3)_2NSi(CH_3)_3$, $(C_2H_5)HNSi(CH_3)_3$, $(C_3H_7)_2HNSi(CH_3)_3$, $(C_4H_9)_2HNSi(CH_3)_3$, $(C_2H_5)_2NSi(CH_3)_3$, $(C_3H_7)_2NSi(CH_3)_3$, $(C_3H_7)_2NSi(CH_3)_3$, $(CH_3)_2NSiH(CH_3)_2$, $(C_2H_5)HNSiH(CH_3)_2$, $(C_3H_7)_2HNSiH(CH_3)_2$, $(C_4H_9)_2HNSiH(CH_3)_2$, $(C_2H_5)_2NSiH(CH_3)_2$, $(C_3H_7)_2NSiH(CH_3)_2$, $(C_3H_7)_2NSiH(CH_3)_2$, $(CH_3)_2NSiH_2(CH_3)$, $(C_2H_5)HNSiH_2(CH_3)$, $(C_3H_7)_2HNSiH_2(CH_3)$, $(C_4H_9)_2HNSiH_2(CH_3)$, $(C_2H_5)_2NSiH_2(CH_3)$, $(C_3H_7)_2NSiH_2(CH_3)$, $(C_3H_7)_2NSiH_2(CH_3)$, $(CH_3)_2NSiH(C_2H_5)_2$, $(C_2H_5)HNSiH(C_2H_5)_2$, $(C_3H_7)_2HNSiH(C_2H_5)_2$, $(C_4H_9)_2HNSiH(C_2H_5)_2$, $(C_2H_5)_2NSiH(C_2H_5)_2$, $(C_3H_7)_2NSiH(C_2H_5)_2$, $(C_3H_7)_2NSiH(C_2H_5)_2$, $(CH_3)_2NSiH_2(C_2H_5)$, $(C_2H_5)HNSiH_2(C_2H_5)$, $(C_3H_7)_2HNSiH_2(C_2H_5)$, $(C_4H_9)_2HNSiH_2(C_2H_5)$, $(C_2H_5)_2NSiH_2(C_2H_5)$, $(C_3H_7)_2NSiH_2(C_2H_5)$, $(C_3H_7)_2NSiH_2(C_2H_5)$, $[(C_3H_7)_2N]SiH_3$, $[(C_4H_9)_2N]SiH_3$, $[(C_5H_{11})_2N]SiH_3$, $[(CH_3)_2N]_2Si(CH_3)_2$, $[(C_2H_5)HN]_2Si(CH_3)_2$, $[(C_3H_7)_2HN]_2Si(CH_3)_2$, $[(C_4H_9)_2HN]_2Si(CH_3)_2$, $[(C_2H_5)_2N]_2Si(CH_3)_2$, $[(C_3H_7)_2N]_2Si(CH_3)_2$, $[(C_3H_7)_2N]_2Si(CH_3)_2$, $[(CH_3)_2N]_2SiH(CH_3)$, $[(C_2H_5)HN]_2SiH(CH_3)$, $[(C_3H_7)_2HN]_2SiH(CH_3)$, $[(C_4H_9)_2HN]_2SiH(CH_3)$, $[(C_2H_5)_2N]_2SiH(CH_3)$, $[(C_3H_7)_2N]_2SiH(CH_3)$, $[(C_3H_7)_2N]_2SiH(CH_3)$, $[(CH_3)_2N]_2Si(C_2H_5)_2$, $[(C_2H_5)HN]_2Si(C_2H_5)_2$, $[(C_3H_7)_2HN]_2Si(C_2H_5)_2$, $[(C_4H_9)_2HN]_2Si(C_2H_5)_2$, $[(C_2H_5)_2N]_2Si(C_2H_5)_2$, $[(C_3H_7)_2N]_2Si(C_2H_5)_2$, $[(C_3H_7)_2N]_2Si(C_2H_5)_2$, $[(CH_3)_2N]_2SiH(C_2H_5)$, $[(C_2H_5)HN]_2SiH(C_2H_5)$, $[(C_3H_7)_2HN]_2SiH(C_2H_5)$, $[(C_4H_9)_2HN]_2SiH(C_2H_5)$, $[(C_2H_5)_2N]_2SiH(C_2H_5)$, $[(C_3H_7)_2N]_2SiH(C_2H_5)$, $[(C_3H_7)_2N]_2SiH(C_2H_5)$, $[(C_2H_5)_2N]_2SiH_2$, $[(C_3H_7)_2N]_2SiH_2$, $[(C_4H_9)_2N]_2SiH_2$, $[(CSH_{11})_2N]_2SiH_2$, $(CH_3)_2NSi(OCH_3)_3$, $(CH_3)_2NSi(OC_2H_5)_3$, $(CH_3)_2NSi(OC_3H_7)_3$, $(CH_3)_2NSi(OC_4H_9)_3$, and the like. One or more selected from the group of theses gases may be used as the modifying gas.

In the hydrophobization step, a hydrocarbon group, a hydrogen group, an alkoxy group, a fluoro group, or a fluoroalkyl group, which is the first substituent, is mainly adsorbed on the surface of the oxide layer to form at least some hydrophobic terminations. However, the hydrophobic terminations formed on the surface of the oxide layer may contain a portion of the first substituent, or may further contain other atoms. Further, in the hydrophobization step, in a case where the modifying gas containing a fluoro group, a fluoroalkyl group, a hydrogen group, or the like as the first substituent may not stably exist as a single compound, a modifying gas containing another first substituent and capable of stably existing as a single compound may be adsorbed on the oxide layer, and then subjected to a specific treatment, thereby converting another first substituent to a hydrogen group, a fluoro group, and a fluoroalkyl group. Examples of a method of converting the first substituent are described below.

As a first example, by causing a modifying gas containing a hydrogen group as a first substituent to be adsorbed on the oxide layer and then exposing the wafer 200 to a fluorine ($F_2$) gas or a hydrogen fluoride (HF) gas, the hydrogen group may be converted to a fluoro group. As a second example, by allowing a modifying containing an alkyl group as a first substituent to be adsorbed on the oxide layer and then exposing the wafer 200 to a fluorine ($F_2$) gas or a hydrogen fluoride (HF) gas, the alkyl group may be converted to a fluoroalkyl group. As a third example, by causing a modifying gas containing a chloro group as a first substituent to be adsorbed on the oxide layer and then exposing the wafer 200 to $H_2$ plasma, the chloro group may be converted to a hydrogen group.

After modifying the oxide layer formed on the first film, the valve 243*b* is closed to stop the supply of the modifying gas into the process chamber 201. Then, gaseous substance and the like remaining in the process chamber 201 are removed from the process chamber 201 by the same processing procedure and processing condition as in the purging in the cleaning step (purging). The processing temperature when the purging is performed in this step may be the same as the processing temperature when the modifying gas is supplied.

(After-Purge and Returning to Atmospheric Pressure)

After the heat treatment step is completed, an inert gas as a purge gas is supplied into the process chamber 201 from each of the nozzles 249*a* to 249*c* and exhausted via the exhaust port 231*a*. As a result, the inside of the process chamber 201 is purged such that gases, reaction by-products, and the like remaining in the process chamber 201 are removed from the inside of the process chamber 201 (after-purge). Thereafter, the atmosphere in the process chamber 201 is replaced with an inert gas (inert gas replacement), and the pressure in the process chamber 201 is returned to the atmospheric pressure (returning to atmospheric pressure).

(Boat Unloading and Wafer Discharging)

Thereafter, the seal cap 219 is lowered by the boat elevator 115 to open the lower end of the manifold 209. Then, the processed wafers 200 supported by the boat 217 are unloaded from the lower end of the manifold 209 to the outside of the reaction tube 203 (boat unloading). After the boat is unloaded, the shutter 219*s* is moved and the lower end opening of the manifold 209 is sealed by the shutter 219*s* via the O-ring 220*c* (shutter closing). The processed wafers 200 are discharged out of the boat 217 after being unloaded from the reaction tube 203 (wafer discharging).

(3) Effects of Embodiments of the Present Disclosure

According to some embodiments of the present disclosure, one or more selected from the group of the following effects may be obtained.

In the oxide layer formation step, the oxide layer containing OH terminations formed at a density higher than that of the OH terminations on the surface of the first film before the oxide layer formation step is formed on the first film, whereby in the hydrophobization step, the surface of the wafer 200 may be sufficiently and uniformly hydrophobized via the oxide layer regardless of the composition of the first film. For example, even in a case where the first film is an O-free film containing OH terminations of a low density, the surface of the wafer 200 may be sufficiently and uniformly hydrophobized via the oxide layer.

In the oxide layer formation step (particularly, the precursor gas supply step and the oxidizing agent supply step of forming the first layer), the processing temperature is set to 150 degrees C. or lower, whereby the oxide layer may be formed while preventing the OH terminations from being desorbed from the surface of the oxide layer. Thus, an oxide layer containing OH terminations of a high density may be formed. By setting the processing temperature to 100 degrees C. or lower, an oxide layer containing OH terminations of a sufficiently high density may be obtained more reliably. In a case where the processing temperature in this step exceeds 150 degrees C., it may be difficult to form an oxide layer with OH terminations of a high density. In a case where the processing temperature in this step exceeds 100 degrees C., it may not be possible to form an oxide layer containing OH terminations of a sufficiently high density.

In the hydrophobization step, the processing temperature is set to 250 degrees C. or lower, whereby the OH terminations formed on the surface of the oxide layer may be prevented from being desorbed from the surface. Thus, it is possible to maintain the density of OH terminations on the oxide layer. By setting the processing temperature to 150 degrees C. or lower, it is possible to reliably maintain the sufficiently high density of OH terminations. In a case where the processing temperature in this step exceeds 250 degrees C., it may become difficult to maintain the density of OH terminations on the oxide layer. In a case where the processing temperature in this step exceeds 150 degrees C., it may not be possible to maintain the sufficiently high density of OH terminations on the oxide layer.

The hydrophobization step is performed at a temperature which is the same as that in the temperature condition in the oxide layer formation step or at a temperature lower than that in the temperature condition in the oxide layer formation step, whereby the hydrophobization may be performed while maintaining the OH terminations on the surface of the oxide layer without causing desorption of the OH termination due to a temperature change in the oxide layer formation step.

A thickness of the oxide layer is set to 1.5 nm or more, whereby a uniform and sufficiently dense terminations may be formed and maintained on the surface of the oxide layer. In a case where the thickness of the oxide layer is less than 1.5 nm, it may be difficult to form and maintain uniform and sufficiently dense terminations on the surface of the oxide layer. In addition, by setting the thickness of the oxide layer to 5 nm or less, it becomes easy to remove the oxide layer in the subsequent step. Further, even in a case where the oxide layer is left as it is, an influence of the oxide layer on device characteristics and the like may be reduced. In a case where the thickness of the oxide layer exceeds 5 nm, it may become difficult to remove the oxide layer, or the influence of the oxide layer on the device characteristics may be increased.

The above-described effects may also be similarly obtained even in the case of arbitrarily selecting and using a predetermined substance (gaseous substance or liquid substance) from the various cleaning agents, various precursor gases, various oxidizing agents, various modifying gases, various catalysts, and various inert gases.

Second Embodiment of the Present Disclosure

Figure 6A:
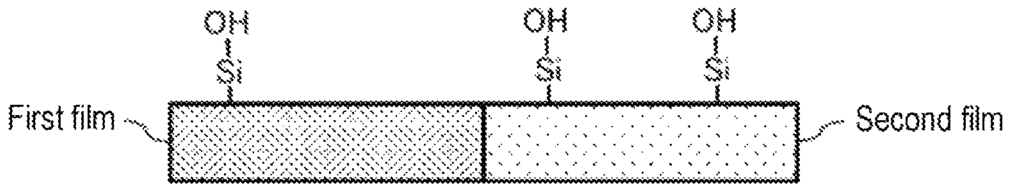
FIG. 6A is a schematic and cross-sectional view showing a surface of a wafer including a first film and a second film.
Figure 6B:
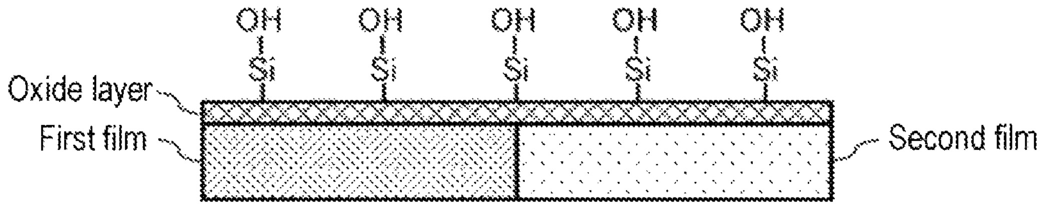
FIG. 6B is a schematic and cross-sectional view showing the surface of the wafer after an oxide layer is formed on surfaces of the first film and the second film by supplying a precursor gas to the wafer in the state of FIG. 6A.
Figure 6C:
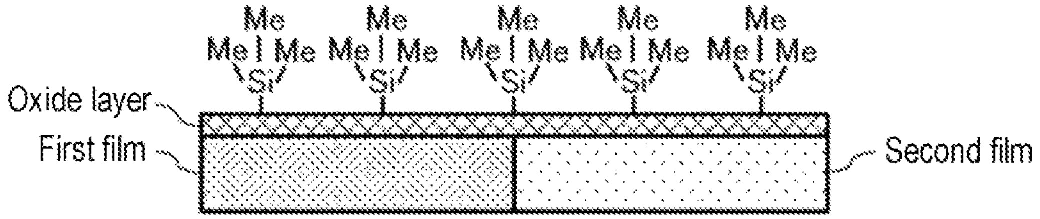
FIG. 6C is a schematic and cross-sectional view showing the surface of the wafer after a surface of the oxide layer is hydrophobized by supplying a modifying gas to the wafer in the state of FIG. 6B.

Hereinafter, as a process of manufacturing a semiconductor device according to a second embodiment of the present disclosure, a method of processing a wafer 200, i.e., an example of a processing sequence of hydrophobizing a surface of a wafer 200 via an oxide layer will be described mainly with reference to FIGS. 6A to 6C. In the following description, operations of the respective components constituting the substrate processing apparatus are controlled by the controller 121.

A first film as a base and a second film with a composition different from that of the first film are formed on the wafer 200. In the following description, for the sake of convenience, a case where the first film is a Si film as an oxygen (O)-free film and the second film is a silicon oxide film (SiO film) as an O-containing film will be described as a representative example.

According to some embodiments of the present disclosure, a processing sequence includes performing:

(a) a step of forming an oxide layer containing a predetermined element on a first film and a second film formed on a wafer 200 by supplying a precursor gas containing the predetermined element to the wafer 200 such that OH terminations are formed on a surface of the oxide layer and a density of the OH terminations on the oxide layer is higher than a density of OH terminations on the surface of the first film before forming the oxide layer on the first film (oxide layer formation step); and (b) a step of hydrophobizing the surface of the oxide layer by supplying a modifying gas containing a hydrocarbon group to the wafer 200 on which the oxide layer is formed (hydrophobization step).

In the embodiments of the present disclosure, a cleaning step, an oxide layer formation step, and a hydrophobization step are performed in the same manner as in the above-described first embodiment.

The cleaning step, the oxide layer formation step, and the hydrophobization step in the embodiments of the present disclosure may be performed in the same processing procedures and processing conditions as those in the cleaning step, the oxide layer formation step, and the hydrophobization step according to the above-described first embodiment. The cleaning step, the oxide layer formation step, and the hydrophobization step according to the embodiments of the present disclosure will be described below.

(Cleaning Step)

In this step, by supplying a cleaning agent to the wafer 200, for example, a native oxide film formed on the surfaces of the first film and the second film may be etched to expose the surfaces of the first film and the second film. At this time, as shown in FIG. 6A, the surface of the first film is kept in a state in which OH terminations are not formed in many regions, i.e., a state in which OH terminations are formed in some regions. As shown in FIG. 6A, the surface of the second film is kept in a state in which the OH terminations are formed at a higher density than the surface of the first film. Thus, the first film and the second film are formed at different densities of the OH terminations on their surfaces. Moreover, the OH terminations formed on the surfaces of the first film and the second film are distributed non-uniformly.

As the cleaning agent and the inert gas used in the embodiments of the present disclosure, it may be possible to use the same cleaning agent and inert gas as in the above-described first embodiment.

In the case of using a wafer 200 kept in a state in which the surfaces of the first film and the second film are cleaned in advance, and, for example, the native oxide films formed on the surfaces of the first film and the second film are removed, the cleaning step may be omitted.

(Oxide Layer Formation Step)

Even in the oxide layer formation step according to the embodiments of the present disclosure, the precursor gas supply step and the oxidizing agent supply step are sequentially executed in the same manner as in the oxide layer formation step according to the above-described first embodiment. The precursor gas supply step and the oxidizing agent supply step according to the embodiments of the present disclosure may be performed in the same processing procedures and processing conditions adopted in the above-described first embodiment.

[Precursor Gas Supply Step]

In this step, a precursor gas containing, for example, Si as a predetermined element is supplied to the wafer 200 to form a Si-containing layer as a third layer on the surfaces of the first film and the second film. The third layer is formed by adsorption of Si contained in the precursor gas on the surfaces of the first film and the second film.

[Oxidizing Agent Supply Step]

In this step, by supplying an oxidizing agent to the wafer 200, at least a portion of the third layer formed on the surfaces of the first film and the second film in the precursor gas supply step is oxidized. As a result, the third layer is oxidized on the surfaces of the first film and the second film as a base, and a fourth layer containing OH terminations formed on a surface thereof is formed.

The precursor gas, the oxidizing agent, and the catalyst used in the embodiments of the present disclosure may be the same as the precursor gas, the oxidizing agent, and the catalyst used in the above-described first embodiment.

[Performing a Predetermined Number of Times]

By performing, a predetermined number of times (m times where m is an integer of 1 or more), a cycle in which the precursor gas supply step and the oxidizing agent supply step are alternately performed non-simultaneously, i.e., without synchronization, an oxide layer whose surface is OH-terminated may be uniformly formed on the first film and the second film formed on the wafer 200. For example, when the precursor gas and the oxidizing agent described above are used, a silicon oxycarbide layer (SiOC layer) or a silicon oxide layer (SiO layer) may be formed, as an oxide layer containing Si as a predetermined element, on the first film and the second film. The above-described cycle may be performed multiple times. That is, a thickness of the second layer formed per cycle is set to be smaller than a desired film thickness, and the above-described cycle may be performed multiple times until a thickness of the oxide layer formed by stacking the fourth layer reaches the desired film thickness, for example, 1.5 to 5 nm.

By performing the oxide layer formation step under the above-described processing condition, the density of the OH terminations formed on the surface of the oxide layer may be made higher than the density of the OH terminations on the surfaces of the first film and the second film before the oxide layer formation step. In addition, a density distribution of the OH terminations formed on the surface of the oxide layer may be made more uniform than a density distribution of the OH terminations on the surfaces of the first film and the second film before the oxide layer formation step. Moreover, regardless of a difference in composition between the first film and the second film, which are base films, the density of the OH terminations formed on the surface of the oxide layer on the first film and the density of the OH terminations formed on the surface of the oxide layer on the surface of the second film may be equalized (see FIGS. 6A and 6B).

(Hydrophobization Step)

In this step, by supplying a modifying gas containing a hydrocarbon group to the wafer 200, it is possible to cause the modifying gas and the OH terminating the surface of the oxide layer to react with each other to hydrophobize the surface of the oxide layer. Specifically, by supplying the modifying gas to the wafer 200, the hydrocarbon group contained in the modifying gas is chemically adsorbed on OH, which is an adsorption site on the surface of the oxide layer, such that the surface of the oxide layer is terminated with a hydrocarbon group. The surface of the oxide layer terminated with the hydrocarbon group becomes hydrophobic. For example, when the hydrocarbon group is a methyl group, the surface of the oxide layer is terminated with the methyl group as shown in FIG. 6C. Thus, the surface of the wafer 200 is hydrophobized via the oxide layer.

According to the embodiments of the present disclosure, in addition to the effects obtained in the first embodiment described above, one or more selected from the group of the following effects may be obtained.

In the oxide layer formation step, the oxide layer containing OH terminations formed at a higher density than the OH terminations formed on the surface of the first film is formed on the first film and the second film, whereby in the hydrophobization step, the surface of the wafer 200 may be uniformly and sufficiently hydrophobized via the oxide layer even when compositions of the first film and the second film are different from each other. For example, even in a case where densities of the OH terminations formed on the surfaces of the first film and the second film are different from each other, the surface of the wafer 200 may be uniformly and sufficiently hydrophobized via the oxide layer.

In the oxide layer formation step, the oxide layer is formed such that the density of the OH terminations formed on the surface of the oxide layer is higher than the density of the OH terminations on the surface of the second film before the oxide layer formation step, whereby in the hydrophobization step, the surface of the wafer 200 may be uniformly and more sufficiently hydrophobized via the oxide layer.

Other Embodiments of the Present Disclosure

The embodiments of the present disclosure are specifically described above. However, the present disclosure is not limited to the embodiments described above, and may be modified in various ways without departing from the spirit of the present disclosure.

(Hydrophobicity Control)

In the above-described embodiments (including the first and second embodiments) of the present disclosure, the examples in which the surface of the wafer 200 is hydrophobized via the oxide layer are described. In the technique of the present disclosure, a level (degree) of hydrophobicity of the surface of the wafer 200 may be further controlled by methods described in the following examples. Processing procedures and processing conditions in the embodiments of the present disclosure may be the same as those in the respective steps in the above-described embodiments, except for points specifically mentioned below.

First Modification: Control by Temperature Regulation in Oxide Layer Formation Step In the oxide layer formation step, as the processing temperature increases, the density of OH terminations formed on the surface of the oxide layer tends to decrease. Herein, as the density of OH terminations reacting with the modifying gas is reduced, a density of hydrophobic terminations such as the terminations of hydrocarbon groups formed on the surface of the oxide layer in the hydrophobization step (i.e., density of a modified layer) is reduced, whereby the hydrophobicity of the surface of the wafer is reduced. In this modification, the density of OH terminations formed on the surface of the oxide layer is controlled to a desired density by regulating the processing temperature in the oxide layer formation step. That is, the processing temperature in the oxide layer formation step is regulated such that the level of hydrophobicity of the surface of the wafer becomes a desired level of hydrophobicity (in other words, such that the density of the hydrophobic terminations formed on the surface of the oxide layer becomes the desired level).

Specifically, for example, a set temperature of the heater 207 or the like is regulated such that the processing temperature in the oxide layer formation step is higher than a predetermined temperature, thereby reducing the density of OH terminations formed on the surface of the oxide layer and reducing the level of hydrophobicity of the wafer surface. Similarly, by regulating the set temperature of the heater 207 or the like such that the processing temperature in the oxide layer formation step is lower than a predetermined temperature, the density of OH terminations formed on the surface of the oxide layer is increased, and the level of hydrophobicity of the surface of the wafer is increased. From another point of view, the processing temperature in the oxide layer formation step is regulated to a predetermined temperature corresponding to the desired level of hydrophobicity of the surface of the wafer such that a level of hydrophobicity of the surface of the wafer becomes the desired level.

Second Modification: Control by Heat Treatment after Oxide Layer Formation Step In the first modification described above, the density of OH terminations formed on the surface of the oxide layer is controlled by regulating the processing temperature in the oxide layer formation step, whereas in this modification, a step of heating the wafer (hereinafter, sometimes referred to as an annealing step) is further performed between the oxide layer formation step and the hydrophobization step to desorb the OH terminations formed on the surface of the oxide layer, thereby controlling the density of the OH terminations.

Specifically, in the annealing step, the wafer on which the oxide layer is formed in the oxide layer formation step is heated to a predetermined processing temperature for a predetermined processing time in an inert gas atmosphere, thereby desorbing the OH terminations until a level of the density of OH terminations formed on the surface of the oxide layer becomes a desired level (i.e. until the density of OH terminations becomes such a density that a level of hydrophobicity of the surface of the wafer becomes a desired level in the hydrophobization step).

As the processing time in the annealing step becomes longer and the processing temperature becomes higher, an amount of desorbed OH terminations becomes larger. Therefore, by regulating at least one selected from the group of the processing time and the processing temperature in the annealing step, the levels of the density of the OH terminations formed on the surface of the oxide layer and the hydrophobicity of the surface of the wafer are controlled to desired levels. From another point of view, by regulating at least one selected from the group of the processing time and the processing temperature in the annealing step to a predetermined processing time and a predetermined processing temperature corresponding to the desired level of hydrophobicity of the surface of the wafer, the level of hydrophobicity of the surface of the wafer is controlled to be the desired level.

The processing temperature in the annealing step may be the same as or higher than the processing temperature in the oxide layer formation step. As the processing temperature in the annealing step is increased, it is possible to promote desorption of the OH terminations formed on the surface of the oxide layer. In addition, by setting the processing temperature in the annealing step to be the same (or substantially the same) as the processing temperature in the oxide layer formation step, it is possible to gently regulate the density of the OH terminations, and it is possible to shorten a time for increasing and decreasing the temperature of the wafer.

Third Modification: Control by Selection of Modifying Gas

The hydrophobic terminations formed on the surface of the oxide layer in the hydrophobization step differs in the level of hydrophobicity given to the surface of the wafer depending on its composition. In this modification, by selecting the modifying gas used in the hydrophobization step, the composition (kind) of the hydrophobic terminations is changed to change the level of hydrophobicity of the surface of the wafer.

For example, among the hydrophobic terminations formed on the surface of the oxide layer, the terminations constituted by a hydrocarbon group, a hydrogen group, and an alkoxy group are formed in such a relationship that "hydrocarbon group>hydrogen group>alkoxy group" in level of hydrophobicity. In this modification, for example, by changing the modifying gas used in the hydrophobization step from a gas containing a hydrocarbon group (i.e., a gas that forms hydrocarbon group terminations on the surface of the oxide layer) to a gas containing a hydrogen group (i.e., a gas that forms hydrogen group terminations on the surface of the oxide layer), the level of hydrophobicity on the surface of the wafer is regulated to be decreased. Similarly, by changing the modifying gas from a gas containing a hydrogen group to a gas containing an alkoxy group (i.e., a gas that forms alkoxy group terminations on the surface of the oxide layer), the level of hydrophobicity of the surface of the wafer is regulated to be further decreased.

Fourth Modification: Control by Supplying Water Vapor-Containing Gas after Oxide Layer Formation Step In this modification, by further performing a step of supplying a gas containing water vapor to the wafer (hereinafter sometimes referred to as a water vapor-containing gas supply step) between the oxide layer formation step and the hydrophobization step, water vapor is caused to react with the surface of the oxide layer to control the density of OH terminations formed on the surface of the oxide layer such that the density of OH terminations is increased.

Specifically, in the water vapor-containing gas supply step, by supplying a water vapor-containing gas for a predetermined time to the wafer on which the oxide layer is formed in the oxide layer formation step, the density of OH terminations formed on the surface of the oxide layer is increased until the density of OH terminations reaches a desired level (i.e., until the density of OH terminations reaches such a level that the hydrophobicity of the surface of the wafer reaches a desired level in the hydrophobization step).

By regulating the processing time in the water vapor-containing gas supply step, the density of OH terminations formed on the surface of the oxide layer and the level of hydrophobicity of the surface of the wafer are controlled to be desired levels. From another point of view, by regulating the processing time in the water vapor-containing gas supply step to a predetermined processing time corresponding to the desired level of hydrophobicity of the surface of the wafer, the level of hydrophobicity of the surface of the wafer is controlled to a desired level of hydrophobicity.

Air containing water vapor may be used as the water vapor-containing gas used in the water vapor-containing gas supply step. When the air is used, after the oxide layer formation step, this step may be performed by unloading the wafer from the process chamber to a space, which is kept in an air atmosphere, such that the wafer is exposed to the air. After performing this step through the exposure to the air, a hydrophobization step is performed. In addition, the oxide layer formation step, the water vapor-containing gas supply step, and the hydrophobization step may be performed in the same process chamber (in-situ).

In the case of first through fourth modifications as well, the same effects as the above-described embodiments may be obtained.

In the above-described embodiments, the case where the first film is the Si film as an O-free film is described by way of example. However, the present disclosure is not limited thereto. The first film, as the O-free film, may be, for example, a film containing a semiconductor element such as a silicon nitride film (SiN film), a silicon carbonitride film (SiCN film), a silicon carbide film (SiC film), a silicon borocarbonitride film (SiBCN film), a silicon boronitride film (SiBN film) or the like, or a film containing a metal element such as a titanium nitride film (TiN film), a tungsten film (W film), a tungsten nitride film (WN film), a hafnium nitride film (HfN film), a zirconium nitride film (ZrN film), a tantalum nitride film (TaN film), a molybdenum film (Mo film), a molybdenum nitride film (MoN), an aluminum film (Al film), an aluminum nitride film (AlN film), a ruthenium film (Ru film), a cobalt film (Co film), a titanium film (Ti film) or the like. In these cases as well, the same effects as the above-described embodiments may be obtained.

In the above-described embodiments, the case where the first film is the O-free film is described by way of example. However, the present disclosure is not limited thereto. For example, the first film may be an O-containing film, for example, a film containing a semiconductor element such as a silicon oxide film (SiO film), a silicon oxycarbide film (SiOC film) or the like, or a film containing a metal element such as a titanium oxide film (TiO film), a titanium oxycarbide film (TiOC film), a tungsten oxide film (WO film), a tungsten oxycarbide film (WOC film), a hafnium oxide film (HfO film), a hafnium oxycarbide film (HfOC film), a zirconium oxide film (ZrO film), a zirconium oxycarbide film (ZrOC film), a tantalum oxide film (TaO film), a tantalum oxycarbide film (TaOC film), a molybdenum oxide film (MoO film), a molybdenum oxycarbide film (MoOC film)), an aluminum oxide film (AlO film), an aluminum oxycarbide film (AlOC film), a ruthenium oxide film (RuO film), a cobalt oxide film (CoO film), a titanium oxide film (TiO film) or the like. Even in these cases, at least some selected from the group of the effects of the above-described embodiments may be obtained. Specifically, even in a case where the first film is an O-containing film, i.e., a film in which OH terminations are formed over most of s surface region of the film, the distribution of OH terminations may not be uniform. In such a case, the surface of the wafer 200 may be uniformly hydrophobized via the oxide layer.

In the above-described embodiments of the present disclosure, the case where the second film is an O-containing film is described by way of example. However, the present disclosure is not limited thereto. For example, the second film may be the O-free film described above.

Further, in the above-described embodiments, the case where the first film is the O-free film and the second film is the O-containing film is described by way of example. However, the present disclosure is not limited thereto. For example, the first film and the second film may be the O-containing films described above, or the first film and the second film may be the O-free films described above. Even in such cases, at least some selected from the group of the effects of the above-described embodiments may be obtained. Specifically, when the first film and the second film are a combination of O-free films or a combination of O-containing films, the densities of OH terminations formed on the surfaces of these films may differ, and the distribution of OH terminations may not be uniform. Even in such a case, the surface of the wafer 200 may be uniformly hydrophobized via the oxide layer.

In the above-described embodiments, the case where in the oxide layer formation step, the oxide layer is formed such that the density of OH terminations formed on the surface of the oxide layer is higher than the density of OH terminations on the surface of either the first film or the second film before the oxide layer formation step is described by way of example. However, the present disclosure is not limited thereto. For example, the density of OH terminations formed on the surface of the oxide layer may be lower than the density of OH terminations on the surface of the second film before the oxide layer formation step. Even in such a case, at least some selected from the group of the effects of the above-described embodiments may be obtained. Specifically, for example, even in a case where the densities of OH terminations formed on the surfaces of the first film and the second film are different, the surface of the wafer 200 may be uniformly hydrophobized via the oxide layer.

Although not specifically described in the above-described embodiments, the cleaning step, the oxide layer formation step, and the hydrophobization step may be performed in the same process chamber (in-situ). By doing so, after the surface of the wafer 200 is cleaned by the cleaning step (after the native oxide film is removed), the oxide layer formation step and the hydrophobization step may be performed without exposing the wafer 200 to the air, i.e., while keeping the surface of the wafer 200 in a clean state. In addition, when the cleaning step may be omitted as described above, the oxide layer formation step and the hydrophobization step may be performed in the same process chamber. This makes it easy to perform a hydrophobization treatment in the hydrophobization step while maintaining the OH group terminations of the surface of the oxide layer formed in the oxide layer formation step. By performing both the oxide layer formation step and the hydrophobization step under the low-temperature condition described above, these steps may be easily performed as a continuous process in the same process chamber. By continuously performing these steps, it becomes easy to perform the hydrophobization treatment in the hydrophobization step while maintaining the OH group terminations of the surface of the oxide layer formed in the oxide layer formation step. The continuous process means that, for example, other process that substantially affect the density and distribution of OH group terminations on the surface of the oxide layer are not performed between the oxide layer formation step and the hydrophobization step. More specifically, the continuous process may include, for example, a case where the surface of the oxide layer is not supplied with another modifying gas that is not used in the oxide layer formation step and the hydrophobization step, a case where the wafer 200 is not subjected to annealing (i.e., a modifying treatment by heating), and the like.

Although not specifically described in the above-described embodiments, after the hydrophobization step, a step (resist coating step) of forming a resist film on the surface of the oxide layer whose surface is hydrophobized may be further included. In this case, since the surface of the wafer 200 is sufficiently and uniformly hydrophobized via the oxide layer, it is possible to allow the resist to be sufficiently and uniformly adhered to the wafer 200.

In the above-described embodiments, the case where in the hydrophobization step, the surface of the wafer 200 is hydrophobized via the oxide layer by supplying the modifying gas to the wafer 200 is described by way of example. However, the present disclosure is not limited thereto. For example, hexamethyldisilazane (HMDS) may be vaporized and applied to the wafer 200 to terminate the surface of the oxide layer with methyl groups. Also in this case, the same effects as the above-described embodiments may be obtained.

Recipes used in the respective processes may be provided separately according to process contents, and may be recorded and stored in the memory 121*c* via an electric communication line or an external memory 123. When starting each process, the CPU 121*a* may properly select an appropriate recipe from a plurality of recipes recorded and stored in the memory 121*c* according to the process contents. This makes it possible to form films of various film types, composition ratios, film qualities and film thicknesses with high reproducibility in one substrate processing apparatus. In addition, a burden on an operator may be reduced, and each process may be quickly started while avoiding operation errors.

The above-described recipes are not limited to newly provided ones, but may be provided by, for example, changing the existing recipes already installed in the substrate processing apparatus. In the case of changing the recipes, the changed recipes may be installed in the substrate processing apparatus via an electric communication line or a recording medium in which the recipes are recorded. In addition, the input/output device 122 included in the existing substrate processing apparatus may be operated to directly change the existing recipes already installed in the substrate processing apparatus.

In the above-described embodiments, the examples in which the film is formed by using a batch-type substrate processing apparatus configured to process a plurality of substrates at a time are described. The present disclosure is not limited to the above-described embodiments, but may be suitably applied to, for example, a case where a film is formed by using a single-wafer-type substrate processing apparatus configured to process one or several substrates at a time. Furthermore, in the above-described embodiments, the examples in which the film is formed by using a substrate processing apparatus including a hot-wall-type process furnace are described. The present disclosure is not limited to the above-described embodiments but may also be suitably applied to a case where a film is formed by using a substrate processing apparatus including a cold-wall-type process furnace.

Even when these substrate processing apparatuses are used, the respective processes may be performed under the same processing procedures and processing conditions as the above-described embodiments and modifications. The same effects as the above-described embodiments and modifications may be obtained.

In addition, the above-described embodiments and modifications may be used in combination as appropriate. Processing procedures and processing conditions at this time may be, for example, the same as the processing procedures and processing conditions of the above-described embodiments and modifications.

According to the present disclosure in some embodiments, it is possible to satisfactorily hydrophobize a surface of a substrate regardless of a composition of a base film formed on the surface of the substrate.

While certain embodiments are described above, these embodiments are presented by way of example, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:

(a) forming an oxide layer containing a predetermined element on a first film formed on the substrate such that hydroxyl group terminations are formed on a surface of the oxide layer and a density of the hydroxyl group terminations on the oxide layer is higher than a density of hydroxyl group terminations on a surface of the first film before (a); and (b) hydrophobizing the surface of the oxide layer by supplying a modifying gas containing a hydrocarbon group to the substrate and causing the modifying gas to react with the hydroxyl group terminations on the oxide layer after (a), wherein in (a), the oxide layer is formed by performing a cycle a predetermined number of times, the cycle including:

(a1) supplying a precursor gas containing the predetermined element and a halogen element to the substrate;

(a2) supplying an oxidizing agent containing oxygen and hydrogen to the substrate; and (a3) supplying a catalyst to the substrate.

2. The method of claim 1, wherein the first film is an oxygen-free film.

3. The method of claim 1, wherein in (a), the oxide layer is further formed on a second film formed on the substrate, a composition of the second film being different from a composition of the first film.

4. The method of claim 3, wherein the density of the hydroxyl group terminations on the surface of the first film before (a) is different from a density of hydroxyl group terminations on a surface of the second film before (a).

5. The method of claim 4, wherein the density of the hydroxyl group terminations formed on the surface of the oxide layer is higher than the density of the hydroxyl group terminations on the surface of the second film before (a).

6. The method of claim 3, wherein the first film is an oxygen-free film, and the second film is an oxygen-containing film.

7. The method of claim 1, wherein the modifying gas is a gas containing an alkyl group.

8. The method of claim 7, wherein the modifying gas is an aminosilane-based gas.

9. The method of claim 1, wherein (a) is performed at a temperature equal to or lower than a processing temperature at which the first film is formed.

10. The method of claim 9, wherein (a) is performed at a temperature of 150 degrees C. or lower.

11. The method of claim 1, wherein (b) is performed at a temperature equal to or lower than a temperature at which (a) is performed.

12. The method of claim 1, wherein (a) and (b) are performed in a same process chamber.

13. The method of claim 1, wherein (b) is performed continuously subsequent to (a).

14. The method of claim 1, wherein a thickness of the oxide layer is 1.5 nm or more and 5 nm or less.

15. A method of manufacturing a semiconductor device, comprising the method claim 1.

16. A method of claim 1, wherein (a) is performed in a non-plasma atmosphere, and wherein a temperature of the substrate in (a) is in a range of room temperature to 150 degrees C.

17. A method of claim 1, further comprising:

(c) before performing (a), removing a native oxide film formed on the first film by supplying a cleaning agent to the substrate.

* * * * *